United States Patent [19]

Cox et al.

[11] Patent Number: 5,440,130

[45] Date of Patent: * Aug. 8, 1995

[54] X-RAY IMAGING SYSTEM AND SOLID STATE DETECTOR THEREFOR

[75] Inventors: John D. Cox; William R. Eisenstadt; Robert M. Fox, all of Gainesville, Fla.

[73] Assignee: General Imaging Corporation, Gainesville, Fla.

[*] Notice: The portion of the term of this patent subsequent to Feb. 27, 2007 has been disclaimed.

[21] Appl. No.: 76,138

[22] Filed: Jun. 14, 1993

Related U.S. Application Data

[63] Continuation of Ser. No. 750,273, Aug. 27, 1991, Pat. No. 5,220,170, which is a continuation-in-part of Ser. No. 462,042, Jan. 8, 1990, Pat. No. 5,043,582, which is a continuation-in-part of Ser. No. 151,235, Feb. 1, 1988, Pat. No. 4,905,265, which is a continuation-in-part of Ser. No. 807,650, Dec. 11, 1985.

[51] Int. Cl.⁶ .......................... G01T 1/24; G01T 1/16
[52] U.S. Cl. ..................... 250/370.09; 378/98.8
[58] Field of Search ............ 250/370.09, 370.11; 378/99, 37, 98.8; 358/111

[56] References Cited

U.S. PATENT DOCUMENTS

| | | | |
|---|---|---|---|
| 4,011,442 | 3/1977 | Engeler | 235/193 |
| 4,067,104 | 1/1978 | Tracy | 250/332 |
| 4,119,841 | 10/1978 | Jantsch et al. | 250/214 VT |
| 4,160,997 | 7/1979 | Schwartz | 348/66 |
| 4,197,469 | 4/1980 | Cheung | 250/370.08 |
| 4,245,158 | 1/1981 | Burstein et al. | 250/370.09 |
| 4,255,659 | 3/1981 | Kaufman et al. | 250/370.09 |
| 4,383,327 | 5/1983 | Kruger | 378/19 |
| 4,413,280 | 11/1983 | Adlerstein et al. | 378/98.8 |
| 4,471,378 | 9/1984 | Ng . | |
| 4,543,534 | 9/1985 | Temes et al. | 330/9 |
| 4,560,877 | 12/1985 | Hoffman | 250/370.11 |
| 4,609,823 | 9/1986 | Berger et al. | 250/370.09 |
| 4,638,165 | 1/1987 | Glasow et al. | 250/370.09 |
| 4,672,454 | 6/1987 | Cannella et al. . | |
| 4,675,739 | 6/1987 | Catchpole et al. . | |
| 4,694,177 | 9/1987 | Akai | 250/370.11 |
| 4,798,958 | 1/1989 | Janesick et al. | 250/370.09 X |
| 4,891,844 | 1/1990 | Kiri | 250/370.09 X |
| 4,905,265 | 2/1990 | Cox et al. | 378/99 |
| 4,940,901 | 7/1990 | Henry et al. . | |
| 4,948,879 | 8/1990 | Guyot . | |

FOREIGN PATENT DOCUMENTS

| | | | |
|---|---|---|---|
| 441521 | 8/1991 | European Pat. Off. | 250/370.09 |
| 3121494 | 1/1983 | Germany | 250/370.09 |
| 57-172273 | 10/1982 | Japan | 250/370.11 |

OTHER PUBLICATIONS

Damerell, "Applications of Silicon Detectors in High Energy Physics and Astrophysics," *Nuclear Instruments and Methods in Physics Research*, vol. 226, No. 1, Sep. 1984, pp. 26–33.

Blouke et al., "Charge-Coupled Device Image Sensors," *Arms Control Verification; The Technologies That Make It Possible*, 1987, pp. 104–120.

Janesick et al., "The Future Scientific CCD," pp. 1–30.

Janesick et al., "Flash Technology for CCD Imaging in the UV," SPIE UV Technology, San Diego, Aug. 1986, pp. 1–20.

"General Characteristics of Silicon Detectors," Dec. 1984, pp. 23–33, 50–53, 59–61, 68–73, 91 and 92.

Koppel, 'Direct Soft X-ray Response of a Charge-Coupled Image Sensor', Rev. Sci. Instrum., vol. 48, No. 6, Jun. 1977, pp. 669–672.

(List continued on next page.)

*Primary Examiner*—Paul M. Dzierzynski
*Assistant Examiner*—Edward J. Glick
*Attorney, Agent, or Firm*—Foley & Lardner

[57] ABSTRACT

The x-ray imaging system comprises an x-ray source for producing an x-ray beam having an energy of at least 30 kVp and an x-ray detector. The x-ray detector comprises a solid state integrated circuit having a silicon substrate and a plurality of charge storage devices. The detector is responsive to x-rays of at least 30 keV to directly produce free electrons which interact with the charge storage devices.

4 Claims, 18 Drawing Sheets

OTHER PUBLICATIONS

Kaufman, et al., 'Semiconductor Gamma-Cameras in Nuclear Medicine', IEEE Transactions on Nuclear Science, vol. NS-27, No. 3, Jun. 1980, pp. 1073-1079.

Loter et al, 'Soft X-ray and XUV Imaging with a Charge-Coupled Device (CCD)-Based Detector', SPIE Solid State Imagers for Astronomy, 1981, pp. 58-61.

Stern et al., 'Evaluation of a Virtual Phase Charged-Coupled Device as an Imaging X-ray Spectormeter', Rev. Sci. Instrum. 54(2), Feb. 1983, pp. 198-205.

Janesick et al., 'CCD Advances for X-ray Scientific Measurements in 1985', SPIE, Cannes France, Nov. 1985, *X-ray Instrumentation for Astronomy*.

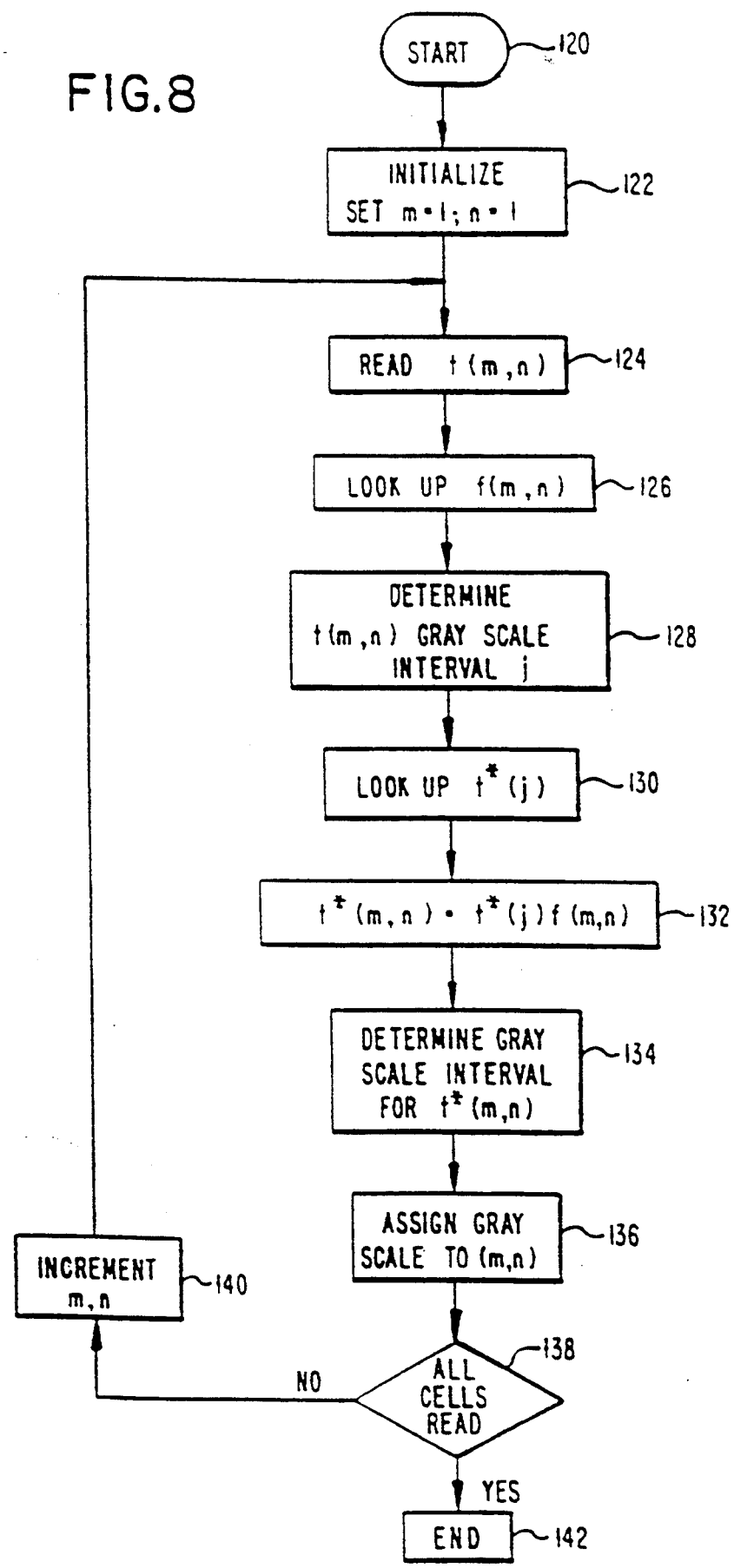

FIG.14 Circuit Diagram

FIG. 15  Detector-Processor Interface

X-RAY IMAGING SYSTEM AND SOLID STATE DETECTOR THEREFOR

CROSS REFERENCE TO RELATED APPLICATIONS

This application is a continuation, of application Ser. No. 07/750,273, filed Aug. 27, 1991, now U.S. Pat. No. 5,220,170 which is a continuation-in-part of Ser. No. 07/462,042, filed Jan. 8, 1990, now U.S. Pat. No. 5,043,582, which is a continuation-in-part of Ser. No. 07/151,235, filed Feb. 1, 1988, now U.S. Pat. No. 4,905,265, which is a continuation-in-part of Ser. No. 06/807,650, filed Dec. 11, 1985.

BACKGROUND OF THE INVENTION

1. Field of the Invention

This invention relates to x-ray imaging systems and to x-ray sensors for use in such systems.

2. Discussion of Related Art

U.S. Pat. No. 5,043,582 to Cox et al. discloses the details of an x-ray imaging system and both a direct conversion solid state x-ray sensor and an x-ray sensor which uses a scintillator to convert x-ray band radiation into visible light. The entire disclosure of U.S. Pat. No. 5,043,582 is incorporated herein by reference.

FIG. 1 shows a unique configuration for an x-ray detector in which a scintillator is positioned in a sandwich structure between a layer containing sensor elements and a layer containing preprocessors. The outputs are taken from the sensors and passed through bump bonds extending through the scintillator to the preprocessors. This configuration has many advantages, however, it would be preferable if such a sandwich structure could be produced in which the sensors and preprocessors could be closer together.

Recently, optical detectors have been developed with MOS capacitors in an epitaxial layer on a substrate, in which the substrate has been thinned so that visible light can be detected by backlighting the detectors from the substrate side rather than illuminating the MOS capacitors directly. This type of detector is discussed, for example, in "Optimizing charge-coupled detector operation for optical astronomy" by Robert W. Leach, *Optical Engineering*, 26(10), pgs. 1061–1066, October 1987, which article is incorporated herein by reference.

SUMMARY OF THE INVENTION

One object of the present invention is to provide a solid state imaging system and detector which are highly sensitive to x-radiation and can produce highly accurate x-ray images.

Another object of the present invention is to provide an x-ray imaging system and detector which can be produced by conventional solid state fabrication technology.

A further object of the present invention is to provide a solid state imaging detector which can be produced in such small sizes as to enable its use in very confined areas.

Another object of the present invention is to provide an x-ray imaging detector which can be substituted directly for x-ray film used in conventional x-ray imaging systems.

Yet another object of the present invention is provide an x-ray detector which is relatively inexpensive to fabricate so as to enable its use in fixed locations for ease of periodic x-ray analysis of mechanical structures and the like.

In accordance with the above and other objects, the present invention is an x-ray imaging system comprising an x-ray source for producing an x-ray field, and an x-ray detector. The x-ray detector comprises a solid state integrated circuit having a plurality of charge storage devices and a circuit for placing a charge on the charge storage devices. The charge storage devices are disposed in an x-ray permeable material and the detector is positioned in the x-ray field such that the charge is dissipated by secondary radiation produced by interaction of the x-ray field in the silicon substrate and metallization layer of the solid state integrated circuit.

The charge storage devices may be divided into groups to form pixels. Each pixel comprises one or a plurality of charge storage devices and the exposure times for discharging the charge storage devices in a single pixel can be different from one another to provide a gray scale.

In accordance with other aspects of the invention, the integrated circuit may be a dynamic random access memory.

Each charge storage device comprises a single cell of the integrated circuit. The cells are spaced from each other such that dead space exists therebetween. Also, the cells are produced in banks of 32,000 with about ¼ mm dead space between banks. A plurality of detectors may be stacked with the cells of the detectors staggered such that each cell of one detector is positioned behind the gap between cells of another detector so as to eliminate all dead space.

The imaging system also includes processing circuitry for accessing the cells of a detector. The processing circuitry may include a system for normalizing the outputs of all of the cells to compensate for various inherent differences in radiation sensitivities of the various cells.

One of the most important aspects of the digital radiography technique employed in the present invention compared to conventional systems using silver halide film is the ability to perform quantitative radiography. This is achieved practically through image digitization and makes subtraction of radiographic images an extremely useful enhancement technique.

The x-ray image detection system according to the present invention is based on direct acquisition of digital information, utilizing solid-state silicon and hybrid detectors. An x-ray image of an object is projected directly onto the sensor without any intermediate x-ray-to-light conversion and signal magnification. Secondary electrons produced by x-ray interactions with the silicon substrate and metallization layer are collected and digitized using techniques similar to those employed for visible light detection.

One of the major concerns of direct x-ray sensing is designing a solid-state sensor that can withstand the radiation dose accumulation sufficiently to justify the cost of replacing the degraded detectors. The sensor must have good x-ray sensitivity compared to other systems with typical x-ray spectra (30 kVp to 200 kVp), and should have a capability of sensing a continuous large format image. To solve this problem, the sensor used in the present invention is a conventional DRAM device. The cost of producing such a device is orders of magnitude less than producing other types of sensors, such as CCD and CID arrays.

Another object of the present invention is to provide an x-ray detector which has a high quantum efficiency to detect low x-ray doses.

Still another object of the present invention to provide an x-ray detector which has the capability of withstanding a large number of exposures without undergoing a degradation in performance.

In accordance with the above and other objects, the invention comprises a scintillator for converting impinging x-rays into visible light; a sensor array having two opposed surfaces with a plurality of detectors at one of the surfaces and having the other of the surfaces facing the scintillator; and a plurality of processing circuits facing the one surface and connected to the detectors by bump bonds.

In accordance with other aspects of the invention, the bump bonds each comprise a first bump on the sensor array, a second bump on the processing circuits and a third bump therebetween.

In accordance with other aspects of the invention, the scintillator comprises a glass plate doped with a phosphor. Alternately, the scintillator may be in the form of a fiber optic fiber, the core of which is doped with a phosphor. Another possibility is that the scintillator is in the form of a crystal phosphor deposited on the sensor array.

The device may also include a first mechanical support connected to the phosphor and a second mechanical support connected to the processing circuits.

Sense and data lines for the detector may be positioned between the sensor array and the processing circuits.

In accordance with other aspects of the invention, the detector comprises a plurality of semiconductor sensors comprising respective MOS capacitors; a gain stage in close proximity to each of the semiconductor sensors for receiving and amplifying charges from the MOS capacitors; and switches positioned to direct charge from the MOS capacitors to the gain stages. A separate gain stage may be provided for each MOS capacitor or one gain stage can be connected to different ones of the capacitors through the switches.

There also may be a circuit for connecting several of the capacitors to one gain stage to add the outputs from the several capacitors and produce a lower resolution real time image, or to connect the several capacitors sequentially to the gain stage to produce a higher resolution static image.

The gain stage preferably comprises a capacitor having smaller capacitance than the capacitor in the sensor.

The device also includes a circuit for transferring packets of charge from a sensor to a gain stage several times during one exposure cycle.

BRIEF DESCRIPTION OF THE DRAWINGS

The above and other objects of the invention will become more readily apparent as the invention becomes more fully understood from the detailed description to follow, reference being had to the accompanying drawings in which like reference numerals represent like parts throughout, and in which:

FIG. 8 is a flow diagram depicting a method of normalizing the cells of the present invention;

DETAILED DESCRIPTION OF THE PREFERRED EMBODIMENTS

Figure 1:
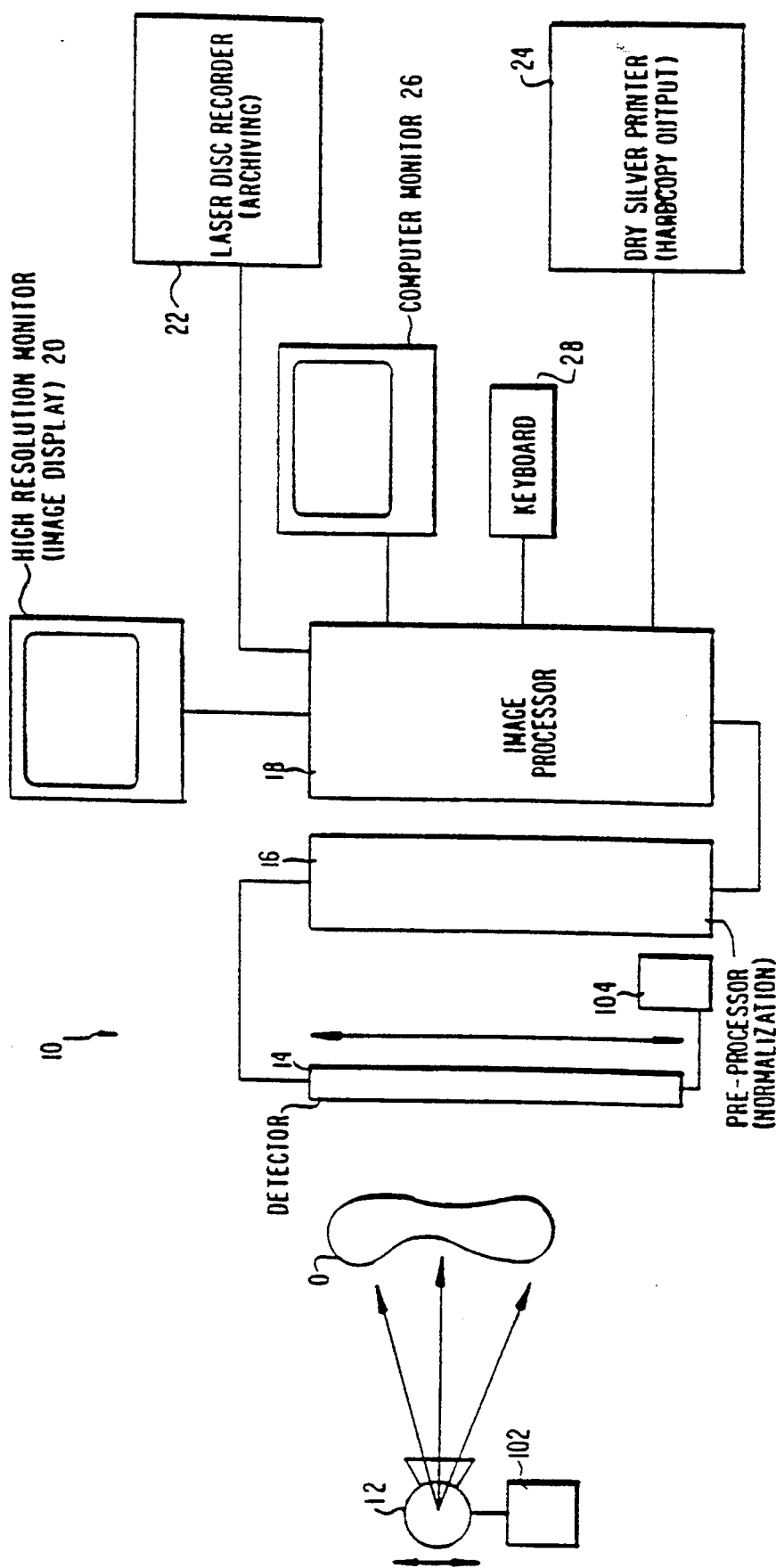
FIG. 1 is a block diagram of the x-ray imaging system of the present invention.

FIG. 1 shows the x-ray system 10 to comprise a high energy x-ray source 12 and a detector 14 positioned to receive the radiation from source 12. Source 12 can be any standard high energy x-radiation source having an output in the range of 8 Kev or higher. Sources such as this are well known and manufactured by, for example, G.E. or Siemens. Alternatively, source 12 be an ultra small focal spot source such as manufactured by Ridge or Magnaflux, also having an output in the range of 8 Kev or higher. Any size focal spot source can be used. Currently, the smallest focal spot available is one micron. Also, the source 12 and detector can be placed as close to the object 0 to be x-rayed as desired due to the configuration of the detector 14, as will become readily apparent.

Detector 14 may be a dynamic random access memory such as the IS32 OpticRAM sold by Micron Technology, Inc. of Boise, Id. This device is an integrated circuit DRAM having 65,536 elements and is used as a solid state light sensitive detector. The Micron DRAM is specifically adapted to sense light inasmuch as there is no opaque surface covering the integrated circuit. However, any type of dynamic random access memory may be used for detector 14 as long as the covering is transparent to x-radiation. In fact, as will become apparent, any type of dynamic memory element may be used as detector 14. The memory element does not have to be a random access memory, although the use of a random access memory facilitates preprocessing and image processing routines.

Moreover, random access circuitry decouples one pixel from another. Unlike charge coupled architecture employed in CCD arrays where one dead pixel affects others in the same row, pixels that are randomly accessible do not affect others should they become defective. This phenomenon plays an important role in the longevity and cost of large-scale imagers where tens of millions of pixels are employed. From the standpoint of longevity, random bit (pixel) failure is a common side effect of radiation damage, as well as manufacturing processes. A 20-million pixel random access imager with 14"×17" dimensions could have as many as ten or twenty thousand dead pixels so long as they were randomly distributed. If one failed pixel could affect others, random bit (pixel) failure would propagate, causing entire rows of pixels to fail, greatly reducing the imager's lifetime and manufacturing yield. Both of these parameters have a direct impact in the cost to produce the imager and the cost per image, respectively.

The IS32 OpticRAM image sensor is a solid-state device capable of sensing an image and translating it to digital computer-compatible signals. The chip contains two arrays each of which contains 32,768 sensors arranged as 128 rows by 256 columns of sensors (4,420 microns×876.8 microns). Each pixel, 6.4 microns on a side, consists of two elements, a MOS capacitor and a MOS switch. The fill factor is 50 percent. The sensor is a random access device and thus, pixels may be individually accessed.

The detector 14 operates by the projection of radiation penetrating the object onto the 65,536 radiation-sensitive elements of each array-pair. Radiation striking a particular element will cause the capacitor, which is initially charged to five volts, to discharge toward zero volts. The capacitor will discharge at a rate proportional to the intensity of the radiation field to which it is exposed.

To determine whether a particular element is black or white, one can read the appropriate row and column address associated with the physical location of the element. The sensor reads the voltage value of the capacitor and performs a digital comparison between the voltage of the capacitor and a fixed externally applied threshold voltage bias. A white pixel indicates the capacitor is exposed to a radiation field sufficient to discharge the MOS capacitor below the threshold point, whereas a black pixel has not received sufficient exposure.

The output of detector 14 is passed to preprocessor 16 which serves the function of normalizing the outputs of all of the cells of detector 14. That is, the sensitivity of the cells of detector 14 will inherently vary. A normalization value can be stored in preprocessor 16 so as to normalize the output of each of the cells to ensure a field describing reading.

The normalized output of preprocessor 16 is passed to image processor 18 which manipulates the data using conventional image processing programs as well as new image processing programs which will be made possible by the present invention, such as "zoom" programs which are not currently in existence. This image can be displayed on a high resolution monitor 20, can be stored on a laser disc recorder 22, can be printed using a dry silver printer 24, or can be sent via satellite to remote image processors (not shown). A menu driven program is displayed on a computer monitor 26 prompting appropriate instructions and data which can be entered into the image processor 18 using a keyboard 28.

Figure 2:
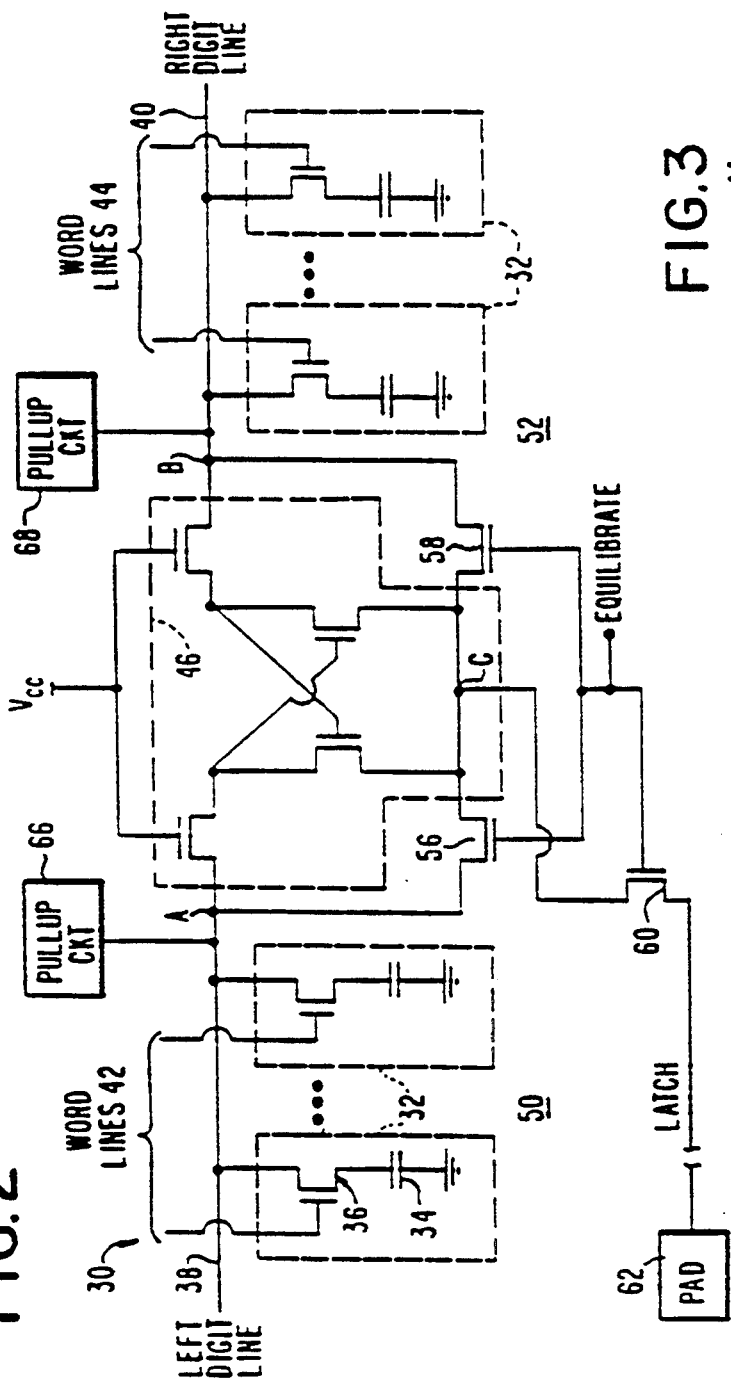
FIG. 2 is a circuit diagram of an integrated circuit detector used in the imaging system of FIG. 1.

FIG. 2 shows a schematic diagram of a portion of a typical DRAM used in detector 14. The circuit 30 comprises a plurality of cells 32, each of which contains a memory capacitor 34 and an access transistor 36. The individual cells are accessed through left and right digit lines 38 and 40, respectively, as well as word lines 42 and 44. A sense amplifier 46 is provided in the form of a cross coupled MOSFET detector circuit. The sense amplifier 46 has nodes A and B which are coupled to the left digit line 38 and to the right digit line 40, respectively. The cells 32 are divided into a left array 50 and a right array 52. The left array 50 is accessed by the left digit line 38 and the right array 52 is accessed by the right digit line 40. The word lines 42 access the individual cells of array 50 and the word lines 44 access cells of the array 52.

A pair of equilibrate transistors 56 and 58 couple the digit lines together to allow equalization of the digit lines at the end of a refresh cycle and during the recharge state of the next cycle.

The common drains of the cross coupled sense amplifier transistors at node C are connected through an isolation transistor 60 to a pad 62 on the periphery of the integrated circuit chip. The pad 62 is bonded to one of the leads of the circuit chip package.

A pair of pull up circuits 66, 68 are coupled, respectively, to the nodes A and B. The pull up circuits 66, 68 are voltage divider circuits operable to control the voltage level of the digit lines 38 and 40.

Figure 3:
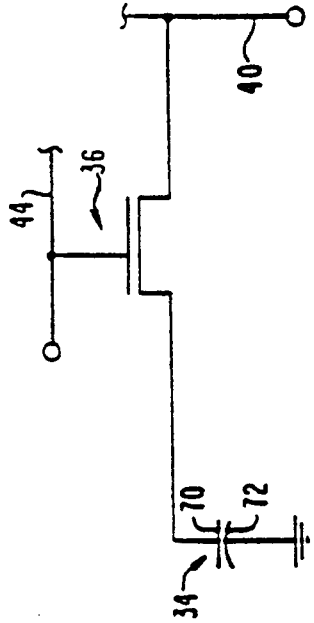
FIG. 3 is an enlarged schematic showing one charge storage capacitor of the circuit diagram of FIG. 2.

FIG. 3 shows one cell of the circuit 30. For convenience, the cell is shown to be one of the array 52 but it could be any of the cells. As shown, the capacitor 34 has two plates 70 and 72 between which a charge is stored. Initially, the capacitor is charged by applying a high potential on word line 44 and a high potential on right digit line 40. This corresponds to a "1" state of the cell. In the presence of incident x-radiation, the charge on capacitor 34 is dissipated as will be discussed below.

Figure 4:
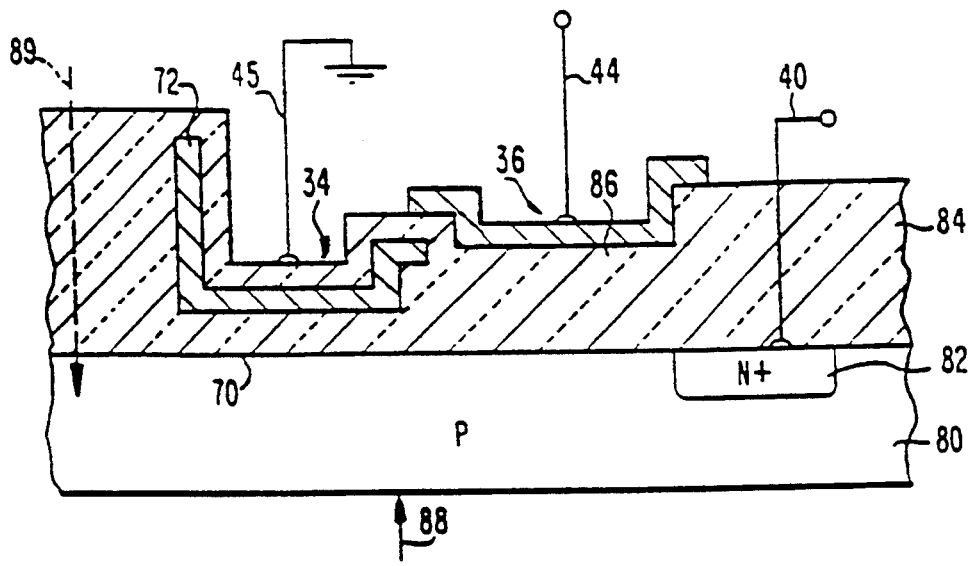
FIG. 4 is a cross section of a chip showing the structure depicted schematically in FIG. 3.

With reference to FIG. 4, the portion of the integrated circuit containing the cell shown in FIG. 3 is set forth in cross section. The circuit comprises a p-type silicon substrate 80 onto which an n+region 82 has been added. A silicon dioxide layer 84 is deposited over the substrate and n+region 82 to form an insulating layer. The lead 40 is connected to the n+region to form the drain of transistor 34. A metal plate 86 is formed on the oxide layer 84 to form an insulated gate of transistor 36. The capacitor 34 is formed by a metal plate 72 and the interface 70 between p-type substrate 80 and oxide layer 84, which forms the other capacitor plate.

When the cell of FIGS. 3 and 4 is set to the "1" state, charge is built up on the interface 70 to charge the capacitor 34. The gate voltage is then lowered so as to discontinue communication between one drain voltage at line 40 and the capacitor 34. This charge is dissipated due to the absorption of x-ray photons in the substrate 80. In FIG. 4, the direction of incident x-radiation is shown by the arrow 88.

The x-radiation can produce free electrons in the substrate 80 either by photoelectric effect, Compton scattering, or pair production. However, because of the high energy of the source used in the present system, the number of electrons produced through photoelectric effect is negligible.

The x-ray energy is in the range where compton scattering and pair production have the highest probabilities of producing free electrons.

It is noted that interconnections between components of a cell and between cells are provided on the oxide layer of the semi-conductor. This is indicated in FIG. 4 by showing the leads 40, 44 and 45 extending out of the oxide layer. Such leads represent the interconnections produced by the metalization layer of an integrated circuit.

Irradiation of the cell 30 from either side results in virtually all of the x-radiation being received in the substrate 80 so that the total electron production for any given energy level of radiation is achieved. The free electrons produced by interaction between the substrate and the x-radiation decrease the charge at junction 70 and thus decrease the charge on capacitor 34.

In conventional x-ray systems, compton scattering and the photoelectric effect are the relevant interactions causing the appearance of free electrons. Rayleigh scattering, a type of coherent scattering may also be responsible for the production of some free electrons. The relative occurrences of the different reactions depends on the energy of the x-ray.

As discussed above, the present invention uses a high energy source. Rayleigh scattering and photoelectric effect are low energy interactions so that the number of free electrons produced by the these effects in the present invention is negligible. There is little direction sensitivity in any of the interactions relating to the production of free electrons except in the case of Rayleigh scattering, which is predominantly forward but also yields the least free electrons.

Referring again to FIG. 2, it will be understood that the circuit 30 is of the type which employs a dynamic-/active/restore sense amplifier of the type described in U.S. Pat. No. 4,397,002, issued Aug. 2, 1983 to Wilson et al., and U.S. Pat. No. 4,291,392, issued Sep. 22, 1981 to Proebsting.

In operation of circuit 30, during one cycle, a given word line 42, 44 in FIG. 2 is brought to a logic one level to enable the addressed access transistor 36. The respective cell capacitor 34 is discharged into the appropriate digit line (e.g. digit line 40 for a capacitor of array 32) changing its value above the equalized value. Then, a latch signal from the pad 62 becomes a logic low state to enable operation of the cross coupled transistors and the sense amplifier 46 during absence of the equilibrate signal. The sense amplifier 46 responds to the latch signal by reducing the opposite digit line (in this case digit line 38) to a ground potential. The digit lines are connected by input/output circuitry (not shown), which provides a digital signal representing the content of the selected memory capacitor 36. The pull up circuits cause the right digit line to be pulled up to the level of the supply voltage. At approximately this time, the storage capacitor 36 which has been connected to the bit line has been restored to its original logic one state. The word line is then returned to ground to isolate the charge on the respective memory cell. The digit lines are then permitted to go low and the equilibration signal becomes a logic high to render the equilibrate transistors 56, 58 conductive to allow the digit lines to be connected for equalization. This permits the charge on the digit lines 38, 40 to be shared such that the digit lines equilibrate to a voltage approximately half way between the supply voltage and ground. A new cycle is thereupon ready to commence.

A factor affecting the performance of the detector is the length of the time which the MOS capacitors are exposed to the radiation field. This period of time is measured from the initial exposure of an element until the time the particular element is read or refreshed. Accessing any pixel in a row causes the entire row to be refreshed. This sets all the row cells that have not leaked below threshold to five volts and sets all cells in the row that have leaked below threshold to zero volts. Optimal imaging conditions exist when the absorbed dose rate is much greater than the discharge rate created by dark current in the capacitor circuit.

There are two factors which have profound effect on the dark current: operating temperature and exposure history. Generally, the lower the operating temperature, the lower the dark current; and the longer the exposure history, the higher the dark current. The dark current of the device directly affects the logic holdtime, or the ability of the sensor to integrate images over time. At room temperature, the logic holdtime or integrating time is approximately 20 seconds. At 40 degrees Fahrenheit the logic holdtime increases to 200 seconds. This has the impact of allowing the sensor to take images in radiation fields 20 times weaker. The sensor, however, is 20% less sensitive at this lower temperature, which is minor compared to the factor of 20 increase in integration time. The sensor also has a much greater resistance to radiation damage at lower temperatures. At room temperature, the chip fails at an absorbed dose of 10 KRads. The chip is considered failed when it can no longer integrate an image more than two seconds. At 40 degrees Fahrenheit, it takes more than 150 KRads, a factor of 15. This is an unexpected result and no explanation for this phenomenon is available.

The best approach to cooling the imager during operation is to place the imager array in direct contact with the cold side of a single or dual stage thermoelectric cooler (such as a thermoelectric cooler manufactured by Melcor, Materials Electronics Products Corporation of 990 Spruce Street, Trenton, N.J. 08648). To maintain a fixed (lowered) operating temperature of the array, a heat sink must be employed on the hot side of the thermoelectric cooler. The heat sink could be in the form of an array of metal fins or a liquid coolant.

The latch signal is placed on pad 62 such that during the equilibrate signal, a voltage potential may be applied to the digit lines when they are connected to effect equilibrium. As will become apparent, the voltage which is applied to the pad 62 allows adjustment to the sensitivity of the image sensor. In particular, the digit line potential acts as a threshold to determine if a particular memory cell 36 is at a high or low voltage level. By raising the potential, cells may leak less before they are considered to be decayed from a logic one to a logic zero value. Accordingly, the sensitivity of the cells can be adjusted by adjusting this potential.

Another way of adjusting the sensitivity of the cells is by etching in different thicknesses of oxide material in the capacitor 34 shown in FIG. 4. In other words, the thickness of the oxide between interface 70 and metal plate 72 determines the sensitivity of the capacitor to x-radiation. The thicker this layer, the more sensitive the capacitor is to radiation discharge. Accordingly, to make a more sensitive detector, the layer should be made thicker and to make a less sensitive detector, the layer should be made thinner. There are, however, limitations to this technique because the impedance of the capacitor must lie in a certain range in order for the circuit to function properly (varying the thickness changes the impedance).

A further technique for adjusting sensitivity is to adjust the exposure time of the detector cells. Using conventional x-ray source controlling equipment, the response of the cells can be adjusted either by using higher energy x-rays or by increasing the intensity of the x-rays. Clearly, in either case, the cells will react more quickly.

The OpticRAM has a broad spectral sensitivity range. In the UV-visible-IR portion of the spectrum (300–1,200 nanometers) the sensitivity is fairly uniform requiring a fluence of about 2 microjoules per square centimeter to discharge the sensor to threshold (typically 2.5 volts). In the x-ray region of the spectrum the fluence required to reach threshold is about 0.2 microjoules per square centimeter (at 120 kVp). The detector responds almost linearly with x-ray energy spectra from 20 kVp to 120 kVp. The response of the sensor below 15 kVp is low totally due to the strong absorption of the filter employed. In fact, most solid-state planar devices have optimum sensitivity in the photon energy range from 1 keV to 30 keV.

The inherent x-ray sensitivity of a silicon sensor is a function of the device structure, process parameters and cell configuration. The usual IS32 OpticRAM is not in the optimum condition in any of those three aspects. The dielectric layer of the device was modified to examine its effect on sensitivity. Test results show that increasing the gate oxide layer thickness from 300 Angstroms to 600 Angstroms increases the detector sensitivity by an order of magnitude. This is interesting since, by doubling gate oxide thickness, one not only doubles the active volume for x-ray interaction in the oxide region (assuming depletion region remained unaffected) but also reduces the total number of events of x-ray interaction necessary for the MOS capacitor to discharge below the threshold point. The expected improvement is about four fold, rather than the 10 fold observed in the measurement. Experiments on the optical sensitivity show only a three fold improvement with the same change. It is not clear what constitutes the dramatic x-ray sensitivity improvement (two-and-one-half times greater than expected). There is an indication that this method may have a limit. In an experiment conducted on an IS6410 OpticRAM, and increase in oxide layer from 600 Angstroms to 800 Angstroms improved detector sensitivity by only 25 percent.

One of the device structural parameters which has been changed is removal of a silicon nitride layer normally deposited on the gate oxide layer of the capacitor. The nitride layer is common in DRAMs to reduce bit soft-errors, but also appears to reduce x-ray sensitivity by about two orders of magnitude. A possible explanation for this observation is that the nitride layer has a greater electron trapping density than the oxide layer. As a result, a significant portion of signal carriers created by a radiation field may be trapped and thus not collected by the pickup circuit.

The x-ray sensitivity of the modified IS32 OpticRAM is in a useful range. Approximately 50 milliRoentgen is sufficient to trigger the IS32 to acquire a binary image exposed to an x-ray energy spectrum of 30 to 120 kVp with 0.25 millimeter aluminum filtration.

Experiments conducted thus far have focused on sensitivity improvements achieved by adjusting parameters that can be easily modified. Already, the sensitivity of the IS32 has been improved to a degree close to that of bare film. It is expected that at least another Order-of-magnitude improvement is possible without requiring a major change in fabrication process and cell configuration.

Sensitivity variation from pixel to pixel is another major concern. Typically, there is a five percent inherent quantum statistical noise present in each pixel and 20 percent bitwise nonrandom sensitivity variation created during fabrication. Though the 20 percent sensitivity variation is nonrandom and can be normalized either by software or hardware, its presence is not desirable because of the additional noise introduced through normalization procedures and the extra time required for image normalization. Several fabrication techniques exist for creating a chip with reasonable sensitivity uniformity (e.g. five percent) including uniform sense line capacitance and a reduction in spatial uncertainty in impurity doping and the oxide laying process.

The cells of the detector are binary in nature. In many applications, it is useful to have a gray scale. This can be accomplished using any of the three techniques discussed above for varying the sensitivity of the cells.

If the digit line potential threshold is varied to vary the sensitivity, a plurality of cells may be grouped to form a pixel. For example, 8 cells per pixel could provide a gray scale having 7 levels, although in practice, 80 cells per pixel (79 gray scales) may be used to provide redundancy at each level of the gray scale. In FIG. 2, if it is assumed that array 32 has 8 cells, ideally, this array could act as a single pixel. During the cyclic operation of the circuit 30, as discussed above, a different digit line potential is applied to digit line 40 when reading each of the memory capacitors 34 of array 32. In this manner, the soak time required for each of the cells 32 to discharge to a low level would be different, thereby providing a gray scale.

The preprocessing circuit 16 of FIG. 1 is programmed to provide the necessary variations in threshold potential, as would be apparent to one of ordinary skill in the art.

Likewise, if each of the cells of array 32 forms a single pixel, each memory capacitor 34 could be produced with a different thickness of oxide layer. In this manner, the capacitors would have inherent differing sensitivities, thus producing a gray scale. Clearly, the number of cells in a pixel can be varied to produce a gray scale having as many levels as desired.

A third means of providing gray scale is to take several x-ray pictures with different soak times and to add the results. For example, with an object having a varying thickness, a plurality of images can be obtained using differing soak times. The lower soak times are used to depict the thinner portions of the object. By adding all of the images together, a multilevel gray scale image is obtained depicting the various thicknesses of the object.

The detector 14 can be produced in any desirable size. Conventionally, the largest silicon chips produced are 6" diameter circular wafers. The wafers are cut into individual integrated circuits and packaged as, for example, dual in-line packs. The detector 14 can be processed by conventional integrated circuit processing techniques and can be packaged in any conventional configuration such as the dual in-line pack.

Figure 5:
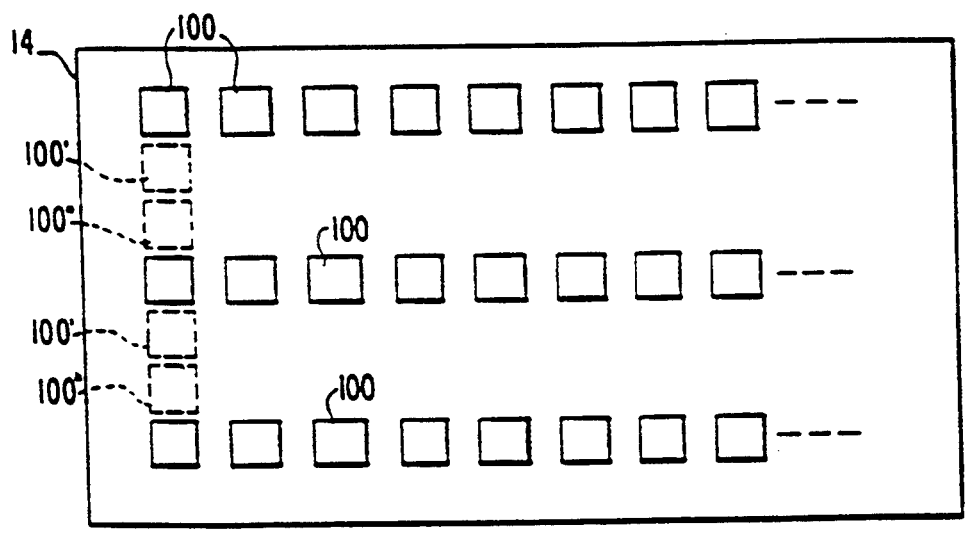
FIG. 5 is a view of a portion of the detector of the present invention stacked over additional detectors to fill up the dead space between cells.
Figure 6:
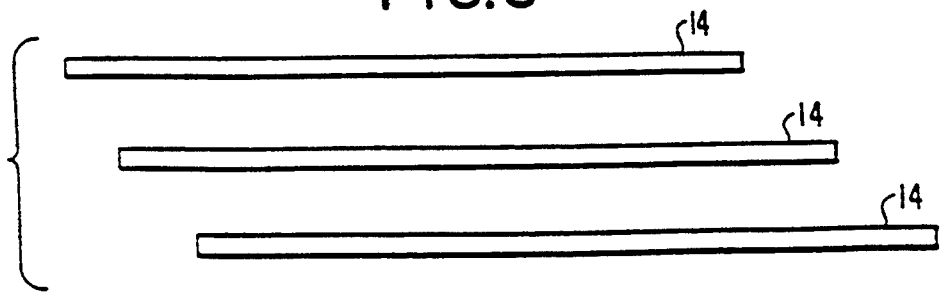
FIG. 6 is an end elevational view of the stacked detectors of FIG. 5.

FIG. 5 shows a portion of a detector 14 having cells 100. The cells are each approximately 8 microns square and the cells of any row are spaced 9 microns from center to center. Thus, these cells are separated by only one micron. Vertically, as shown in FIG. 5, the cells are spaced 25 microns from center to center. Also, the cells are arranged in banks of 32,000 with approximately ¼ mm space between the banks. The dead space between cell banks is required to accommodate the trunk lines to the cells. The arrangement of cells in one integrated circuit is sufficiently dense to provide a very high resolution x-ray image for most applications. However, if an even higher resolution is required, since each chip is relatively transparent to radiation, a plurality of chips can be stacked and offset relative to one another to fill the gaps between cells and/or between the banks of cells. For example, as shown in FIGS. 5 and 6, three detectors 14 are stacked and offset so that the cells of the lower two detectors are positioned between the cells of the upper detector. In FIG. 5, the cells of the lower detectors are indicated in phantom as cells 100' and 100''. Accordingly, it can be seen that a single detector can be built using three integrated circuits in which virtually all of the available area is filled with cells.

As an alternative to stacking detectors, several sequential images can be taken with either the source 12 (FIG. 1) or the detector 14 being moved between each x-ray exposure. This motion is produced by oscillating supports 102 or 104 shown in FIG. 1.

Figure 7:
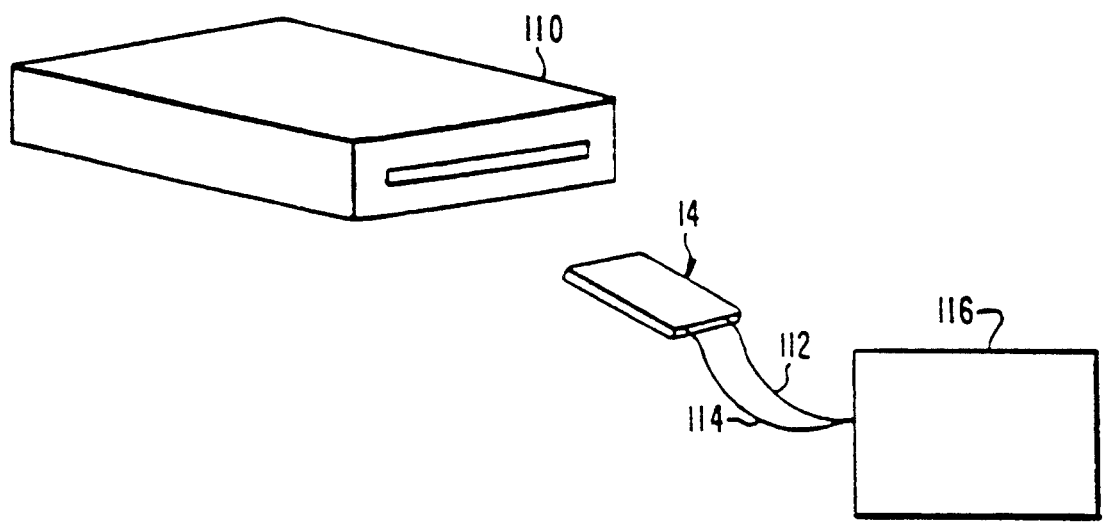
FIG. 7 is a diagrammatic representation showing the system of the present invention used in place of x-ray film.

The integrated circuit itself is about ½ mm thick. The entire detector can be made about ½ inch thick, including all necessary connections etc. Accordingly, a detector 14 can be substituted directly for x-ray film in almost all existing x-ray devices. As shown in FIG. 7, the detector 14 can fit directly into an x-ray film receptacle 110 with leads 112 and 114 being connected to the processing section 116 which contains preprocessor 16, image processor 18, etc. Processing section 116 may be a computer with the preprocessor and image processor being software components.

Another advantage of the fact that the detector 14 can be produced in small sizes is that relatively small detectors can be permanently located in virtually inaccessible areas of structures to be x-rayed. For example, structural elements in aircraft are required to be examined periodically using x-ray techniques. This normally requires disassembly of major structural components. However, with the present invention, an x-ray detector can be permanently mounted in place and the detector leads can be made accessible through a plug or the like. In this manner, x-ray analysis of structural components can be carried out quickly and easily. Also, since the detector 14 is made using conventional integrated circuit techniques, its cost is relatively low thus also contributing to the feasibility of utilizing a plurality of small x-ray detectors 14 on a component requiring x-ray analysis.

Furthermore, the small size of the x-ray detector 14 enables it to be placed in body cavities such as the ear or the like to facilitate clear clinical diagnostic x-ray images.

The fact that each cell of detector 14 is small in size enables the use of an x-ray source 12 having the smallest focal spot available. Also, since the cells are relatively closely packed, the present invention can be used in zoom radiography without requiring any change in the distance between the source and the detector. Normally, the size of an x-ray image can be increased by increasing the distance between the object and the detector. However, in the present invention, due to the large number of cells in the detector, the image can be electronically enlarged without significant loss of resolution by merely displaying the image on a larger fraction of the screen. Further, as discussed above, if additional resolution is required, detectors 14 can be stacked as shown in FIGS. 5 and 6.

Due to the small size of the cells of the invention, greater resolution can be achieved with little or no cross talk between the cells. That is, the length of travel of the most energetic secondary radiation produced by interactions between the x-ray beam and the silicon substrate 80 (FIG. 4) is approximately 10 microns. Since this is also the separation distance between cells, there is very little probability that radiation impinging upon one cell will result in noise being produced in an adjacent cell.

Furthermore, the present invention is suited for microradiography since the cells are small and closely packed. The resolution attainable using the invention is sufficiently high to permit an accurate representation of objects having an area on the order of 1,000 square microns.

Figure 9:
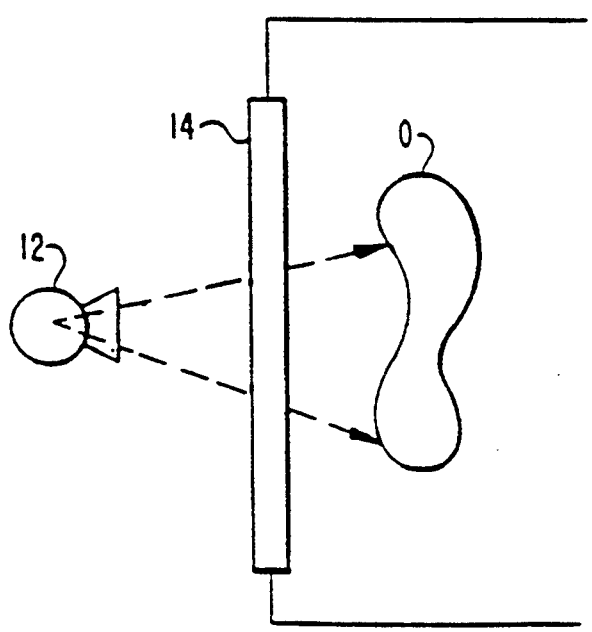
FIG. 9 shows the orientation of the detector and the detector leads for backscattering images.

Also, because of the digital nature of the present invention and its inherent compactness, it is possible to configure an x-ray imaging system in a unique way that permits the user to view the internal structure of objects where it is not possible or practical to place the imaging media behind the object. As shown in FIG. 9, the x-ray source 12 is placed directly behind the detector 14 which can be placed directly on or in front of the object 0 to be viewed. In this configuration, the x-ray field produced by the source penetrates through the detector and impinges on the object. The image of the object is created in the detector by back scattered radiation from the object. The image produced in the detector 14 is that of the object 0 produced by back scattering superimposed on an image of the source 12 produced by the x-ray field passing through the detector 12 initially. The image of the source 12 can be removed by subtracting it from the total image. That is, an image of the source alone is produced by irradiation of the detector 14 with no object present and digitally subtracting this image from that of the combined object and source image.

It should be noted that it is preferable to orient detector 14 in FIG. 9 such that the connection leads extend out of the side facing the source. In this way, the detector can be positioned closer to the object 0 and the image of the leads, etc. will be present when the image of the source alone is produced and thus will not appear in the final image after digital subtraction.

Furthermore, by varying the energy of the x-ray field with multiple exposures, back scatter tomography is made possible, wherein a 3-D image of the object can be constructed.

The measured inherent sensitivity of cells of a detector varies by about 20%. Furthermore, it has been discovered that the sensitivity of the detector 14 is varied by prolonged exposure to x-radiation. That is, as cells of the detector are exposed, they become more sensitized to radiation in the future. Thus, detectors which receive less radiation dose because they are shadow shielded by an object are less sensitized than those exposed to direct or less attenuated radiation. Therefore, the relative sensitivity of each detector varies according to its own history of exposures. X-ray applications with typically useful image gray scales do not allow such large sensitivity variations and thus require sensitivity normalization. Such normalization can be carried out using the following technique. For the following discussion it is assumed that the detector comprises one half of a basic IS32 detector configuration, i.e. a $128 \times 256$ cell array contained in a spatial area $876.8 \times 4420$ microns. The cells are arranged in 128 rows and 256 columns. Presuming that the cells are illuminated by a source which generates a uniform intensity field at the sensor, a distribution of "exposure times" t, will be obtained to register a cell discharge. The individual cells are denoted by $t(m,n)$ where m is $1,2,3, \ldots$, M and n is $1,2,3, \ldots$, N. The letter m signifies the row index and the letter n signifies the column index. In the present example, M is 128 and N is 256. Denoting the average value of this array of 32,768 values by $t^*$, note that the 20% variability discussed above means that the difference of $t(m,n)$ and $t^*$ to be as large as $0.2 t^*$. The cell array normalization factors can be defined by $f(m,n)$ equals the ratio of $t^*$ to $t(m,n)$. Thus we can generate the array $f(m,n)$ where m is $1,2, \ldots$, M and n is $1,2, \ldots$, N. In measuring the set of values $t(m,n)$ we must set a time increment used to step through the cells. Certainly this increment should be less than $0.2 t^*$ or the measurement will be of little value.

Where gray scale is produced by sequential exposures of the object with different exposure times, the gray scale will be specified by a set of contiguous exposure time intervals. Denote the increasing bounds of these intervals by $t(j)$ where j is $0,1,2, \ldots$, J. This defines a J-gray scale image mode (typically J is 8, 16, 32 or 64) bounded by a low exposure time of $t(0)$ and a high exposure time of $t(J)$. The j-th shade of gray is bounded by exposure times of $t(j-1)$ and $t(j)$. The image intensity measured by the radiation field at sensor locations varies inversely with j.

In a particular image obtained with the J-gray scale just described, an array of values $t(m,n)$ will be obtained where m is $1,2, \ldots$, M, and n is $1,2, \ldots$, N*. The values of M, and N, are respectively equal to or less than M and N depending on either the fraction of cells used, or cell spatial averaging procedures. This array of cell exposure times contains the image information. Since image exposure times are only at the specified values $t(0), t(1), \ldots, t(J)$ the image values of $t(m,n)$ will fall in one of the discrete J gray scale intervals and no further detailed knowledge can be presumed. Each cell response to the image must be corrected by the sensitivity normalization $f(m,n)$. There are a variety of ways that this correction can be applied.

One method of carrying out this correction is shown by the program of FIG. 8. This program is run to read each cell at each exposure. In other words, the first exposure time $t(0)$ may be 1.1 sec, the second exposure time $t(1)$ may be 1.2 sec, etc. After each exposure, all of the cells $t(m,n)$ are read and the information output from each cell is stored in a matrix.

In FIG. 8, the program is started at step 120 and the variables are initialized at step 122. This includes setting m and n equal to one. At step 124, the value of the first cell $t(m,n)$ is read and the normalization factor for that cell is looked up at step 126. At step 128, the gray scale interval j is determined. For example, if the cells are being read after the first exposure and the exposure time is 1.1 sec, the gray scale interval j would be 1.1–1.2 sec. If the second exposure time is 1.2 sec, the second gray scale interval would be 1.1–1.2 sec, etc.

At step 130, an exposure time $t_*(j)$ characteristic of the j-th interval for each j is identified. For example, $t^*(j)$ could be the simple average: one-half of the sum of $t(j)$ and $t(j-1)$. In other words, if the interval 1.1–1.2 sec is the current interval j, it is necessary to assign a single value $t_*(j)$ to the exposure time. This value may be, e.g., 1.15 sec. Then, at step 132, for each image spatial location $(m,n)$ which has an image value $t(m,n)$ in gray scale interval j, calculate $f(m,n)t_*(j)$ which yields the corrected value $t^*(m,n)$. This value: 1) falls in interval j and then the assignment of gray shade j for $(m,n)$ is maintained; 2) falls in some other interval j' and then the assignment of corrected gray shade j' for $(m,n)$ is accomplished; 3) is less than $t(0)$ and then $(m,n)$ is assigned "white"; or 4) is greater than $t(J)$ and then $(m,n)$ is assigned "black". The determination of the gray scale interval for $t_*(m,n)$ is made at step 134 and the actual assignment of the gray scale is made at step 136. Clearly the choice of $t_*(j)$ and the validity of the procedure is less uncertain when the intervals $t(j-1)$ to $t(j)$ are "small". Small is relative to expected cell sensitivity variation over the image in question. At step 138, a determination is made as to whether all cells have been read. If the answer is "no" the values of m and n are incremented at step 140 according to a predetermined schedule and the value of the next cell is read. After all the cells are read, the program ends at step 142.

Silicon planar devices including the IS32 OpticRAM are sensitive to radiation damage. Two of the major effects of radiation damage to MOS sensors are: (1) positive space charge formation in the oxide layer, and (2) surface fast-state generation ar the silicon-oxide interface.

It has been shown that the charge buildup causes shifts in the operating point of the MOS switch, catastrophic increase in the reverse current of the p-n junction and variations in their breakdown voltage. The increase in fast surface state density is responsible for the lowering of the transconductance of MOS switches, and, in combination with the space charge buildup, for the reverse current increase in the MOS capacitor.

Figure 11:
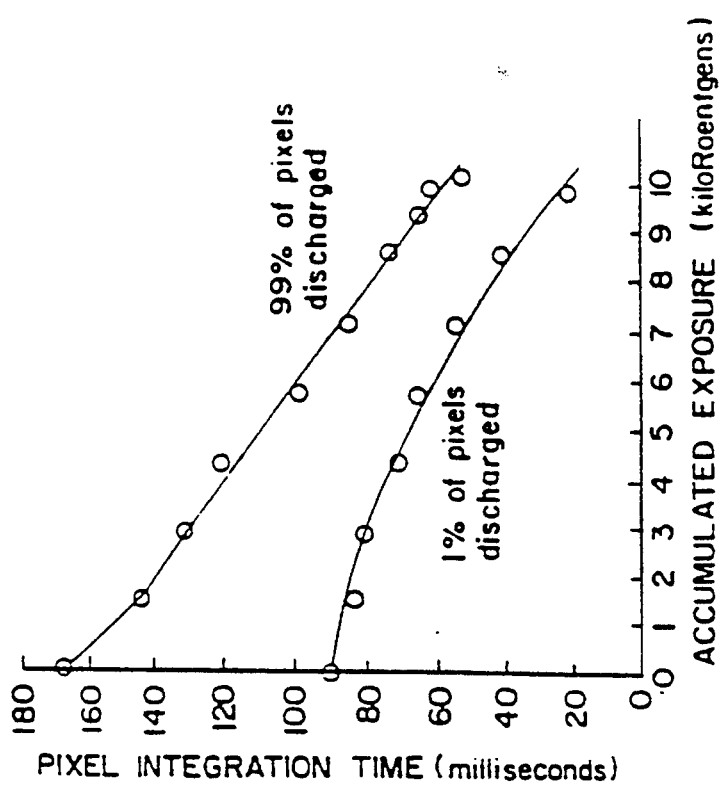
FIG. 11 is a graph showing pixel integration time as a function of accumulated exposure based on data taken at 120 kVp filtered through 0.25 mm Al.
Figure 10:
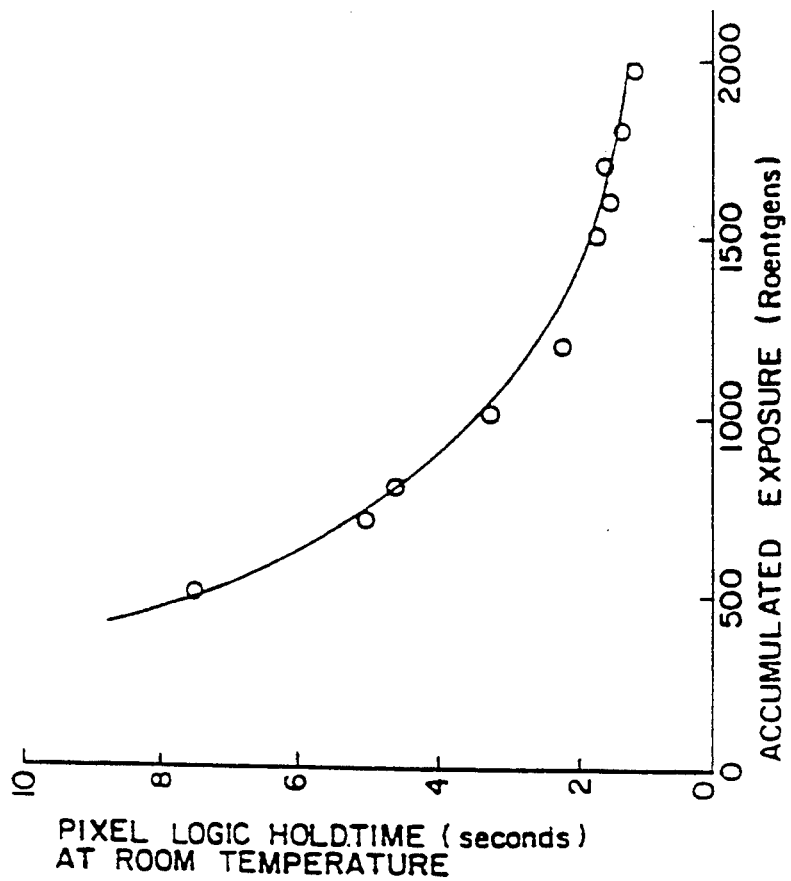
FIG. 10 is a graph showing pixel logic hold time as a function of accumulated radiation exposure based on data taken at 120 kVp filtered through 0.25 mm Al with 50% of total detecting pixels discharged beyond the threshold point.

A fresh IS32 OpticRAM with no prior history of radiation exposure normally possesses a 40 to 50 second logic holdtime (i.e., time required for a precharged pixel to deplete its logic state from high to low in an unilluminated condition) at room temperature. The logic holdtime decreases with accumulated radiation exposure due to increased dark current. FIG. 10 gives a typical representation of the logic holdtime as a function of the total exposure of the IS32. The data plotted in FIG. 10 were derived from 120 kVp x-rays filtered through 0.25 mm Al with 50% of total detecting pixels discharged beyond the threshold point. As can be seen, an average pixel can maintain a high logic state for only one second after two kR accumulated exposure. The chip functions irregularly as the logic holdtime approaches zero and eventually fails catastrophically. The degradation of chip performance as a direct x-ray sensor can best be observed in FIG. 11 which is compiled from experiments performed to study the effect of leakage current on sensor interrogation time at room temperature. In FIG. 11, the top curve illustrates the integration time for 99% of the total detecting pixels to discharge. The lower curve illustrates the integration time for 1% of the total detecting pixels to discharge. Data was taken using a 120 kVp x-ray spectrum filtered through 0.25 mm Al. As shown in the figure, dark current becomes significant at two kR accumulated exposure, and at eight kR exposure it contributes more than 50 percent of the charge released within the capacitor for the same exposure conditions. To reduce the dark current contribution, a greater radiation intensity is required.

The radiation induced damage results in detectors with varying logic hold times (or DC leakage rates) depending on the cumulative amount of dose absorbed by each detector. Thus, it is possible to create latent images on the sensor array by taking repeated images of the same object. Detectors in the shadow of the object will be less affected by radiation than those exposed directly to the illuminating field. After many images have been acquired with a detector array, a fixed pattern of detectors with different DC leakage rates is created. Fortunately, the DC leakage rate differences between detectors may be normalized in the same way the 20 percent nonrandom bitwise sensitivity variation created during manufacture is normalized. Under such circumstances, normalization matrixes are needed for raw image processing; one to smooth out the sensitivity variation due to the built-in uncertainty originated from the fabrication process and the other one for those variations due to the performance degradation from radiation damage. Practically, one merely obtains a new single normalization matrix periodically during the useful lifetime of the chip. This periodically-updated normalization matrix is then employed for the next exposure interval. Presumably, the chip is not functional as an image sensor if either of the following thresholds is reached:

1) the noise level from the normalization of DC leakage rate variations and nonrandom noise pattern is significant compared to the signal amplitude (say 10 percent), or
2) the DC leakage level is so large that the signal content in the cell does not provide sufficient quantum statistical validity.

The effective life of the detector, which is a function of absorbed dose, chip operating temperature and other parameters, is on the order of 10 kR. Cooling and periodic UV annealing should significantly prolong the useful lifetime of the chip.

The IS6410 OpticRAM, also produced by Micron, has a spatial configuration which makes it useful for testing the performance of the chip as a direct x-ray imager. It is composed of two rows of IS32 OpticRAM array-pairs, five in each row, in a single die (FIG. 5). Only the top or bottom eight discrete array-pairs are utilized (for 8-bit processing). It has 524,288 pixels in an area of 0.8 square centimeter. The active area is actually 0.67 square cm with a "windowpane" conducting area occupying 0.13 square centimeter. The IS6410 was interfaced with an image processor in the form of an IBM PC/AT. Since this detector is in fact a DRAM, the interface consists of an extended memory controller board and a driver circuit. The chip is designed to produce only one binary image per exposure because the cell is read out destructively. The present approach to build up an image gray scale uses integration time. This requires a separate exposure for each gray level, each of which is longer than the previous exposure. Therefore, to obtain a picture of N gray levels, a total of N−1 exposures is required.

The spatial and contrast resolution of the detector is determined by a number of factors. The spatial resolution is determined by the larger of either the pitch of sensing pixels (in this case less than 10 microns) or the range of the secondary particles generated from x-ray interaction (Compton electrons). For typical x-ray energies (between 30 keV and 150 keV) the range of Compton electrons within silicon is also on the order of 10 microns. Thus, the spatial resolution of this device is about 10 microns, or about 40 line-pairs per millimeter. The contrast resolution is ultimately limited by quantum noise. Since we can arbitrarily set the integration time, the contrast resolution is also arbitrary. As a practical matter, a one percent signal (Contrast) variation is the minimum detectable variation.

The fact that the device is also a memory device leads to new concepts in electronic imaging. For example, the x-ray source could be controlled by the detector, or various parts of the sensor could vary their integration time. The image processor could interrogate the sensors to determine if they have received adequate exposure. Through a feedback mechanism, the exposure could be controlled so that there were no underexposed or overexposed sensors. This concept makes possible intelligent image sensors (retinas) or machine vision, opening new horizons for information management.

The IS6410 OpticRAM is found to be an order of magnitude less sensitive to x-rays than its counterpart IS32 OpticRAM. Tests conducted to compare logic holdtime of both chips as a function of total radiation exposure indicate both suffer the same rate of performance degradation from radiation. This implies that pixels of both chips have the same x-ray conversion efficiency but different charge coupling efficiency. One plausible explanation of why these two sensors, which basically share the same cell layout, may exhibit different x-ray sensitivity is that, in order to stagger 10 IS32 array-pairs on a single die and package the die in a standard carrier, changes of chip circuit layout are required. As a result of the changes, the efficiency and the ability to read the information stored on the MOS capacitor can be hampered. A smaller portion of radiation-induced carriers passes through the sense line and is successfully collected by the pickup circuit. It is expected that in the next generation sensor where wafer scale integration is required, the problem of reading information stored in pixels will be significantly resolved.

There are many aspects of the device, such as the circuit architecture and the control logic, that require changes in its present arrangement in order to optimize its function as an x-ray imaging device. Three major areas requiring improvement are: 1) detector sensitivity to x-rays, 2) complete gray scale readout from a single exposure, and 3) scale-up to conventional image format size.

Low x-ray sensitivity is mainly caused by the effect of capacitance loading and the small active volume of the capacitor. To alleviate the problem of low x-ray sensitivity, several steps can be taken, including but not limited to increasing capacitor (detector) volume and area, optimizing the ratio of the sense line impedance and detector impedance, and increasing the sensitivity of the comparator circuit. Cell capacitance can be increased by depositing a MOS capacitor with a larger area and/or laying down a high dielectric medium (e.g. SiN sub x) in addition to the silicon oxide. The cell capacitance alters the efficiency of charge collection induced by the radiation field, and also alters the efficiency and ability to read information stored on the capacitor. The absolute value of the capacitance of the sensing element plays a role in determining the sensitivity of the sensor to the radiation field. The ratio of the cell capacitance to the sense line capacitance affects the cell's efficiency, by affecting the user's ability to read the information or to measure the charge on the capacitor.

Several fabrication techniques exist for creating low capacitance sense lines including double diffusion and metal deposition. The primary task in this step is to combine the various fabrication techniques to produce a chip with optimum sensitivity and uniformity.

The IS6410 OpticRAM produces only binary image information per exposure because the cell is read out destructively. This requires a separate exposure for each gray level, each of which is longer than the previous exposure. Therefore, to obtain a picture of 256 gray shades, a total of 255 exposures is required. This is an undesirable situation and produces a very slow and radiation intensive imaging device.

Several cell configurations are available to correct the current limitations of binary image sensing. These include: 1) an analog DRAM, 2) a cell with internal gain, and 3) a nondestructive readout (NDRO) cell with an internal comparator.

The analog DRAM is basically an X-Y addressable MOS imager, such as the MOS imager manufactured by Hitachi because the Hitachi device has an analog readout, although the Hitachi device is not random access. The Hitachi MOS imager requires no major modification to make it a direct x-ray imager, but it has a low charge coupling efficiency. Cells with internal gain, such as the static induction transistor and the charge modulation detector are attractive, but are still in the research and development stage. The NDRO cell will have no problem with charge readout because of the short distance signal carriers are required to travel. However, it is potentially a very slow imaging device due to the number of times a pixel must be accessed to build a complete picture.

Selection of the best cell configuration is a complicated task which involves consideration of structural parameters and chip fabrication processing constraints. At this writing, it is not clear which is the best configuration of each concept or which concept is superior.

Direct x-ray imaging techniques, though producing large magnification and high spatial resolution, suffer the drawback of a small image format size. Currently, the largest existing solid-state detector size for direct x-ray detection is approximately one-half inch in diameter (e.g., direct x-ray vidicon tubes manufactured by Hamamatsu Photonic Systems in Waltham, Mass., or Teltron, Inc., in Douglasville, Pa.). To expand the field of view of a solid-state silicon detector to a level significantly greater than the current capability, several techniques including wafer scale integration are under investigation. One possible approach is to bond out entire wafers containing thousands of IS32 cells. Four major problems are foreseen: 1) dead silicon space between sensor chips, 2) effect of capacitance loading on sense lines, 3) fixed pattern noise, and 4) replacement cost increases with size of image field-of-view.

The dead silicon area will cause a "windowpane" effect on images. To reduce the windowpane effect one can, during the image taking process, either perform multiple exposures at various view angles until the whole picture is covered or stack multilayer thin wafers, one on top of another, filling up the dead space in other wafers. Only two or three wafers are required to fill up the blind space depending on the chip arrangement on the wafer.

Effects of capacitance loading on sense line and fixed pattern noise will be significant if image information has to be down loaded directly from a pixel to the edge of each wafer. Signal conversion to digital form on the chip level is an attractive approach to mitigate the sensitivity problem caused by the capacitance loading of the sense line and the resulting fixed pattern noise. The main issue here is to expand the image format to a reasonable size without sacrificing uniformity of pixel information readout over this entire imaging surface.

The previous descriptions of detector 14 relate to monolithic devices. However, advances have been made in thin film technology in which semiconductor, metal and insulator layers are deposited sequentially to form a device. This type of process is particularly well suited to the fabrication of x-ray detectors incorporating MOS capacitors, as discussed above, in addition to an absorber layer having an atomic number Z which is higher than silicon so that the mass-energy transfer coefficient of the detector is increased. This type of technology also enables the absorber to be placed close to the MOS capacitors so that free electrons produced in the absorber can directly interact with the capacitors. In other words, at the x-ray energy level of interest, free electrons are produced in the absorber primarily due to photoelectric events with high quantum efficiency. These free electrons affect the charge on the MOS capacitors. Since the quantum efficiency of the absorber is higher than that of silicon alone, the change in charge on the capacitor is greater and the sensitivity of the device is improved.

Many silicon on insulator (SOI) devices have been proposed and the fabrication techniques involved in their production are well known and will not be discussed in detail here. The following discussion will focus on an embodiment of the present invention in the form of a solid state x-ray image acquisition device comprising a matrix of two dimensional silicon photodiode arrays coupled directly through indium bumps to a matrix of silicon based preprocessors.

Figure 12:
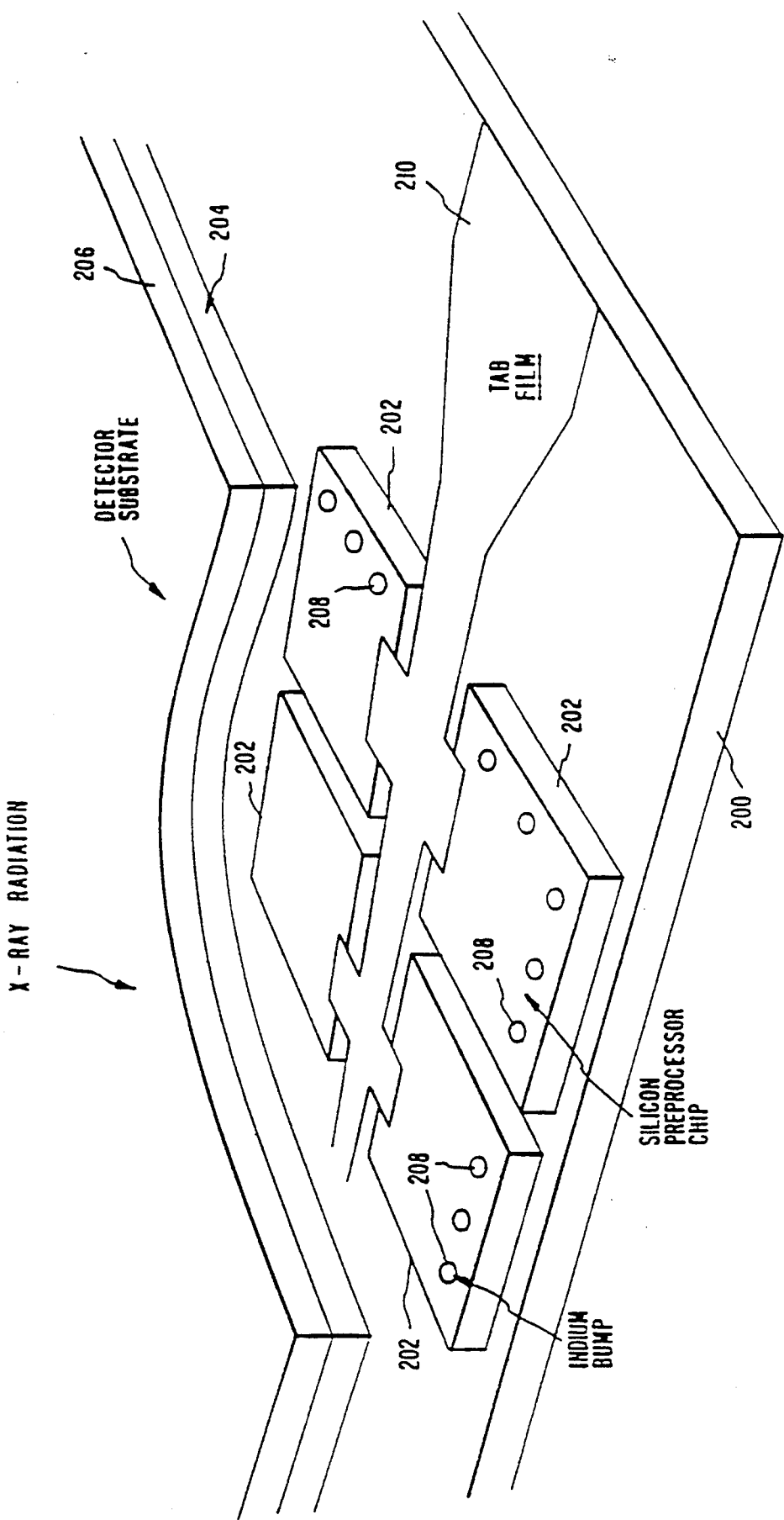
FIG. 12 shows a thin film detector embodiment of the present invention.

FIG. 12 shows the basic layout of the device which includes an insulating substrate 200 to provide mechanical support, a plurality of preprocessor chips 202, and a detector layer 204 which includes another mechanical support 206. The detector layer 204 contains a plurality of MOS sensing elements and circuitry for randomly accessing the sensing elements. The outputs of the sensing elements are connected to the preprocessors 202 through indium bumps 208 and the outputs of the preprocessors 202 are taken through a conductive tab film 210.

Figure 13:
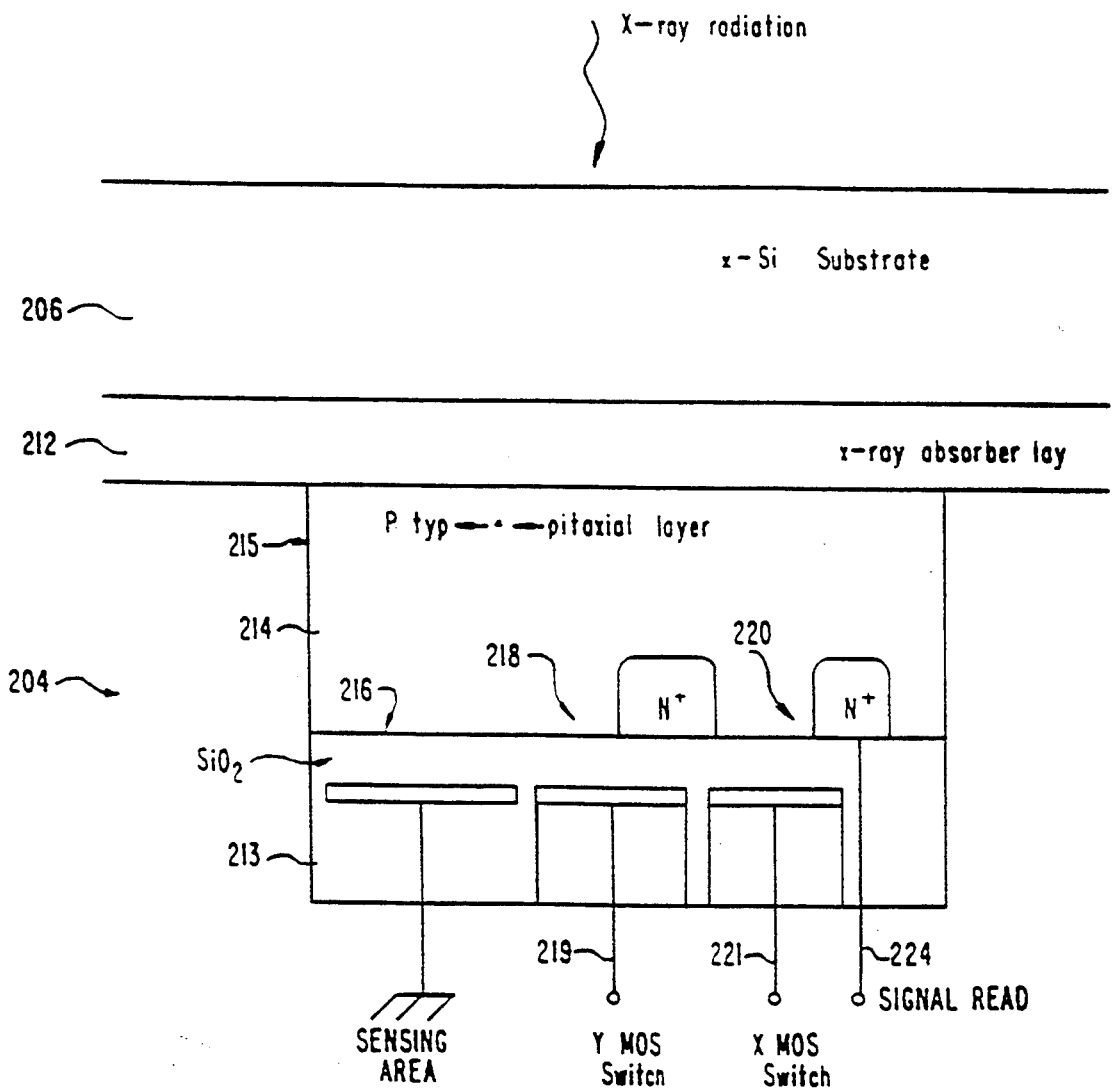
FIG. 13 is a cross section of one detector of the embodiment of FIG. 12.

FIG. 13 shows the composition of the detector layer 204 which contains the support 206. Support 206 may be an amorphous silicon substrate as is conventional in thin film technology. An x-ray absorber layer 212 is formed on the support 206 by any convenient process such as vacuum deposition. The x-ray absorber layer 212 should be formed of a material having a high atomic number but should not alter the thermal properties of the device. Tungsten or tungsten carbide has the properties required for a good absorber. That is, these materials have a higher atomic number than silicon and but have a thermal expansion coefficient which will not affect the integrity of the device. However, any other material having the required characteristics may also be used.

A plurality of individual sensing devices 215 are formed on the absorber layer. The sensing devices are formed in blocks arranged in a matrix wherein each block consists of 512×512 sensing elements and all the necessary conductors and connection pads. Each sensing device occupies an area about 0.1 mm square and includes a P-type epitaxial silicon layer 214 formed on the absorber layer 212 and a silicon dioxide layer 213 on the polycrystalline silicon layer 214. Each device includes a sensing area 216, a y MOS switch 218 and an x MOS switch 220. Each sensing device is the same as one of the MOS sensors discussed above relative the monolithic structures. The sensing area 216 is an MOS capacitor whose charge is altered by the free electrons produced in response to the photoelectric events in the absorber layer 212. Each sensing area 216 capacitor should be relatively large in order to improve sensitivity. Preferably, each capacitor should be about 50 microns on a side, although a smaller size capacitor may also work as well. Each sensing device is essentially one cell of an analog DRAM and the charges on the capacitors can be individually read out by accessing the cells through the x and y switches using word lines and digit lines which control the level on the y MOS switch line 219 and the x MOS switch line 220. The signal on the capacitor is read out on line 224.

Figure 14:
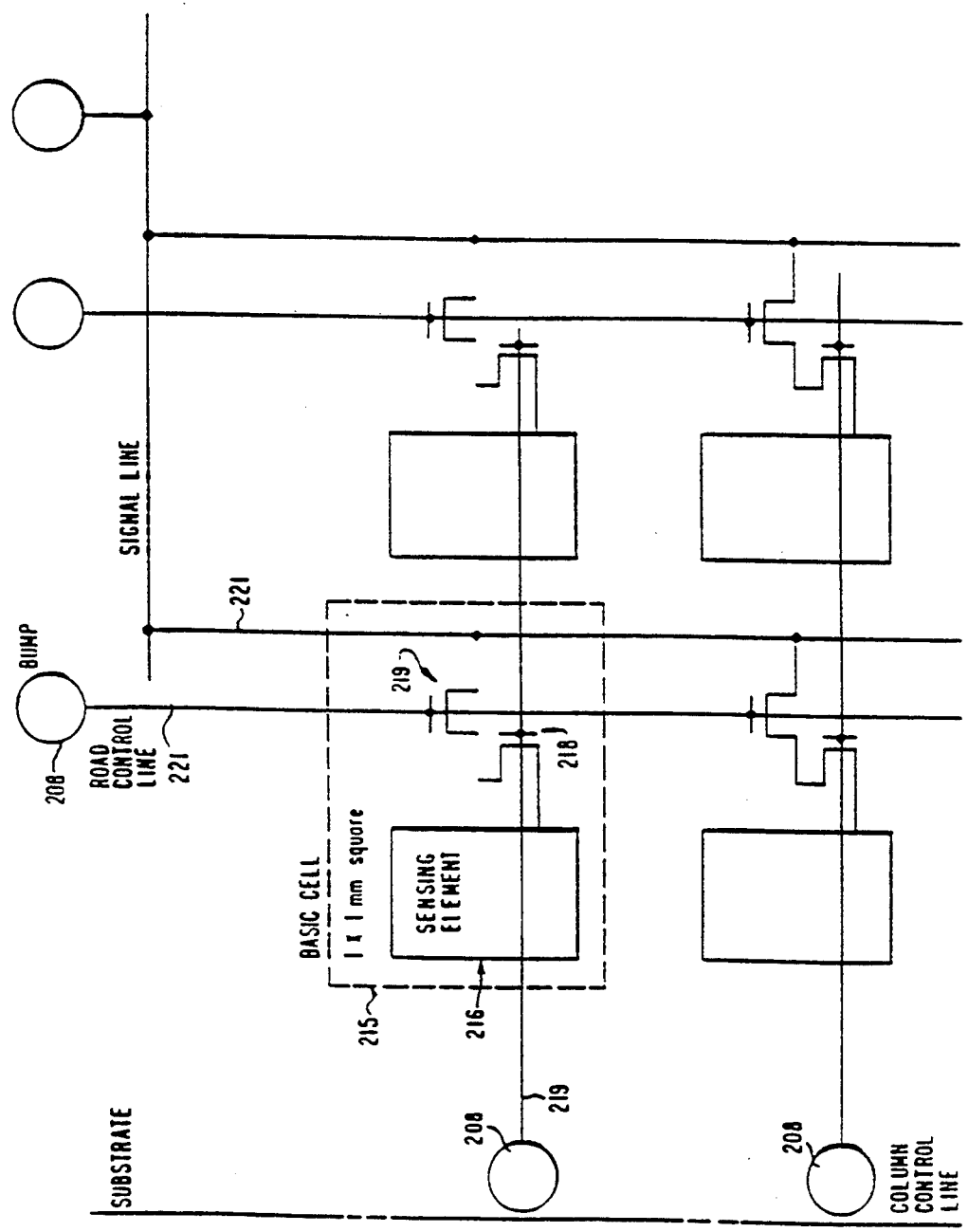
FIG. 14 is a circuit diagram of the detector of FIG. 12.

FIG. 14 shows the layout of a portion of one block of sensing devices 215. With a basic cell size of 0.1 mm square, the sensing devices of the present invention can be used to form a high resolution x-ray detector. The connections to the sensing devices are made through indium bumps 208 to the preprocessors below.

With the above described configuration, a large size matrix such as 14 inches by 17 inches can be built by adding more blocks. The final size will be limited mainly by the fabrication process. With each sensing device occupying an area of about 0.1 square mm, it will take as many as 14.336 million sensing elements or 7×8 blocks to have a 14 inch×17 inch square x-ray imager, As each sensor block is coupled to a preprocessor, it requires 56 preprocessors arranged in 7×8 format to accommodate all of the sensing elements.

Figure 15:
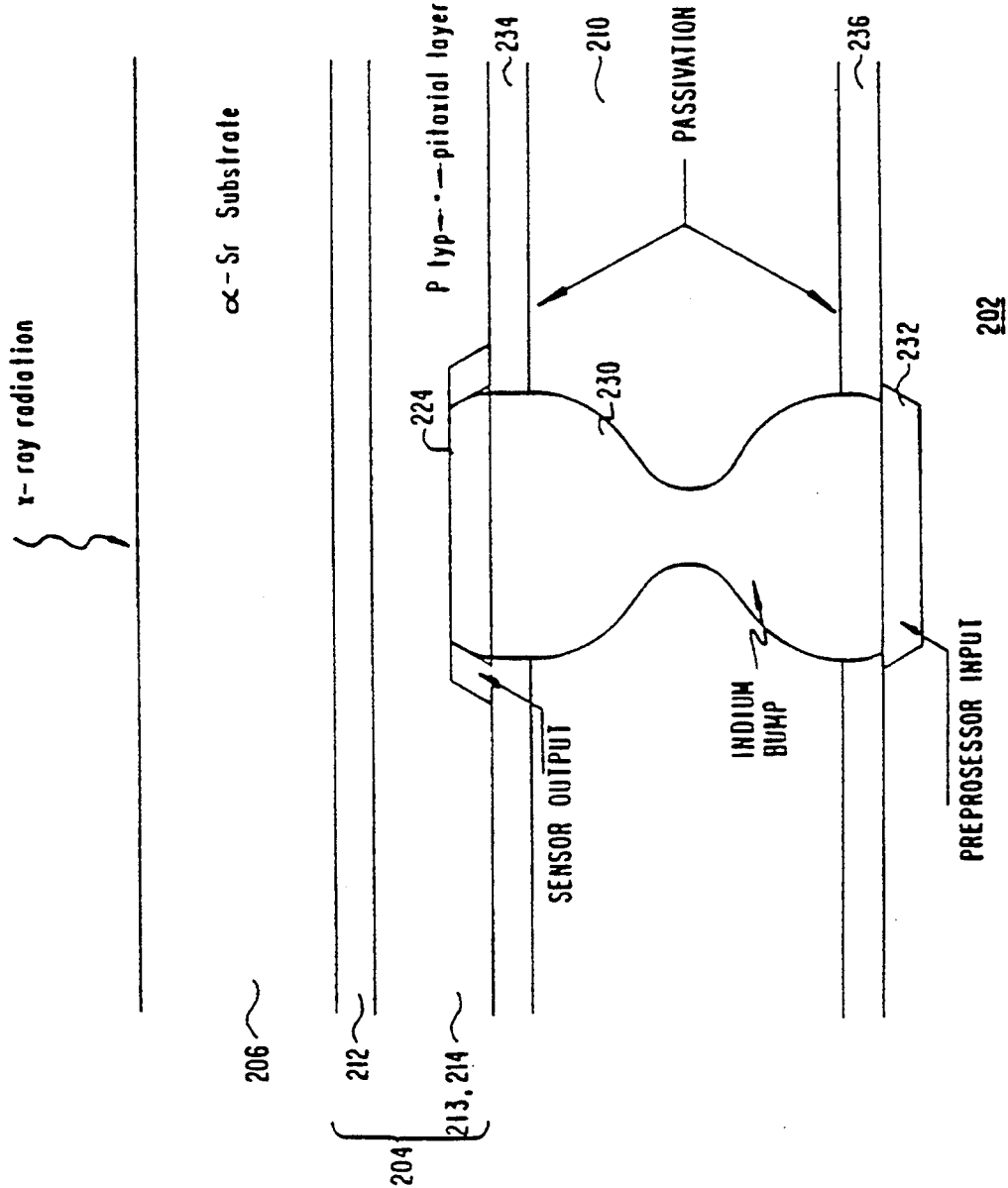
FIG. 15 is a cross section showing the interconnection between the sensing layer and the preprocessor portion of the detector of FIG. 12.

FIG. 15 shows the structure for connecting the switching and signal lines of the sensing elements to the preprocessors 202, which are formed on a layer below the sensing elements. As seen in FIG. 14, an indium bump extends from the preprocessor 202 to the associated sensing element formed in layer 204. One indium bump is provided for each such connection. The indium bump shown in the figure is for connecting the sensor output line 224 to the input line 232 of the preprocessor. As will be understood, a similar indium bump is provided for each connection including the connections for the x and y switch lines.

A passivation layer 234 in the form of, for example, silicon oxide, is formed on the sensing layer 204 and the indium bumps extend through the passivation layer into contact with the sensing elements. The tab film 210 occupies the space between the passivation layer 234 and a second passivation layer 236. Below the second passivation layer 236, the preprocessors are formed using conventional processes. The tab film 210 comprises conductors which connect the preprocessors externally of the device.

Each preprocessor has four main devices, a multiplexor, readout electronics, a digitizer, and control electronics. The multiplexor selects a pixel or sensing element at a certain (x, y) location to be read out by turning on and off corresponding x and y MOS switches. The residual electronic charges released are then quickly collected by the readout circuit through the indium bump connection. The multiplexor can operate in either random access mode or scanning mode depending on the circuit design. The readout electronics may be any one of a number of conventional readout circuits. However, it is preferred that an analog readout be obtained and that a direct-injection bipolar current circuit be used for this purpose. The control electronics provide necessary control and I/O logic signals to interface to the outside world and control the multiplexor. There may also be a digitizer in each preprocessor chip. A flash A/D converter would be adequate for this purpose. The circuitry of the preprocessor is convention and will not be discussed in detail here. Essentially this circuitry is presently in use in connection with visible light detector arrays such as the Hitachi MOS imager. The manner in which such circuitry would be used in the present invention is therefore obvious to one of ordinary skill in the art.

It is noted that the embodiment of FIGS. 12-15 may be in the form of a random access device or not. Since the cell size is increased, the number of cells is decreased per unit area and it is possible to easily read all of the cells. Consequently, the composition of the preprocessor would vary depending on whether random access is desired or not.

The embodiment of the invention shown in FIGS. 12-15 solves many of the problems discussed above in regard to the monolithic detector. Certainly, the sensitivity problem is solved both by the use of an absorber and by scaling up the size of the capacitor. In addition the present embodiment can be scaled up in size to a conventional image format size. This can be done with no loss of resolution since, by virtue of the thin film technology, the external connections which previously gave rise to the "windowpane" effect. Finally, by the use of analog readout circuitry, a full gray scale can be obtained with a single exposure.

Another possibility for obtaining good resolution is to use a device similar to the OpticRam and apply an absorber. In fact, it has been found that the metallization layer of the IS32 acts as an absorber and the x-ray detection characteristics of this device could be improved by applying the metallization layer in such a manner that it overlies all of the cells more uniformly. As is well known, the metallization layer is the layer on an integrated circuit which provides interconnection between the cells. Accordingly, in this case, the metallization layer acts both as an absorber to enhance x-ray detection and as the cell interconnection layer.

The foregoing embodiments of the invention provide excellent sensitivity and are especially suitable for commercial application such as nondestructive testing where dose is not a limiting factor. In medical applications, the dose given to a subject must be limited to less than 500 mR, requiring an increased sensitivity of the device. The intrinsic sensitivity of the sensor array can be improved by addition of a phosphor, as in detector 300 shown in FIG. 16. The relative location of the elements of detector 300 is similar to that in FIGS. 12-15 and detector 300 shares the advantages of this layout.

Figure 16:
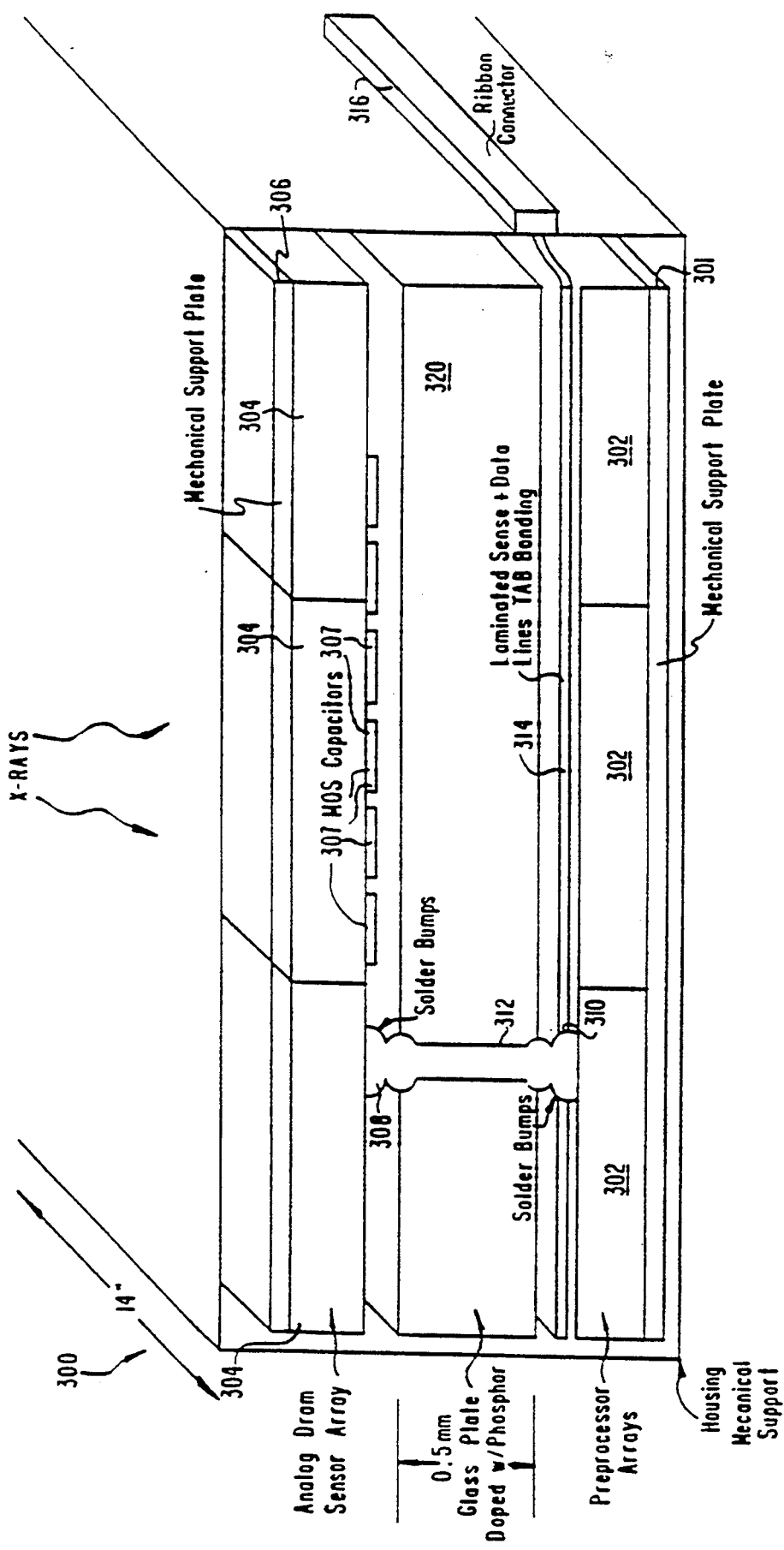
FIG. 16 is a perspective cross sectional view of a further embodiment of the present invention in which a scintillator is used to convert x-rays to visible light.

As shown in FIG. 16, the detector 300 comprises a first mechanical support 301, a preprocessor array having a plurality of preprocessor chips 302 mounted on the mechanical support 301, and sensor arrays 304 mounted on another mechanical support 306. Each sensor array 304 contains a plurality of MOS capacitors 307 interconnected by control and signal lines similar to the arrangement shown in FIG. 14. Solder bumps 308 are connected to each control line and each signal line, also as depicted in FIG. 14 with respect to solder bumps 208. The solder bumps 308 are connected to corresponding solder bumps 310 on the preprocessors via gold and/or solder connectors 312. Connector 312 can be in the form of a hole about 50 microns in diameter filled with gold or solder. This provides a multilayer structure wherein the MOS capacitors 307 can be randomly accessed yet closely spaced by virtue of the solder bump connections which avoid "dead spaces" in the resulting image by communicating the control and sense lines of the sensor array out of the arrays to the preprocessors. The preprocessors 302 communicate externally of the detector 300 through tab bonded laminated sense and data lines 314. The tab bonding comprises a thin piece of plastic with the sense and data lines laminated therein. The tab bonding connects to a ribbon connector 316 which connects to a processor such as a PC or other such image processor which extracts data and supplies power to the imager. The sense and data lines from the tab bonding may be attached to the preprocessor or may attach directly to solder bumps leading to the sensor arrays 304.

The foregoing characteristics of detector 300 are similar to the detector of FIGS. 12-15, except that the sensor arrays 304 and the support therefor should not have any added absorber and should permit x-rays to pass. The other main difference between these structures is that detector 300 has a glass plate 320 positioned between the sensor arrays 304 and the array of preprocessors 302. Glass plate 320 is doped with a phosphor such as gadolinium oxysulfide to produce a phosphor screen scintillator for converting impinging x-rays to visible light rays. Doping can be achieved by laminating a powdered phosphor between two layers of glass. The phosphor has a higher intrinsic absorption characteristic to the x-ray field than the absorbers discussed in connection to other embodiments of the present invention, making detector 300 amenable for use in low dose applications.

Because the MOS capacitors in the present embodiment are intended to receive visible light generated in the glass plate 320, it is imperative that they not be obstructed. In order to optimize the optical coupling between the MOS capacitors 307 and the phosphor screen 320, all circuits in the arrays 304 should be routed to uncover the individual capacitors 307 to enhance their sensitivity to the visible light emitted by the phosphor screen.

The glass plate 320 is about 0.5 mm thick and is drilled with an array of 50 micron holes which are subsequently filled with gold or solder connectors 312 to the point where the gold or solder leaves an array of bumps on both sides of the glass to make contact with the solder bumps 308 and 310. The glass plate 320 is used both for the receptor to convert the x-ray field to a visible light field, as well as a mechanical support to support both the sensor arrays 304 and the preprocessor array 302.

The sensor arrays 304 are preferably arrays of analog DRAM sensors which consist of many individual array panels containing hundreds or thousands of sensors. Each of the sensor arrays is on the order of one to two inches on a side containing the MOS capacitors and all necessary FETs, analog amplifiers and sense lines. The individual one or two inch sensing arrays 304 are glued onto the thin metal backing 306 which allows them to be butted together as close as possible. The sensor arrays can be closely adjacent, leaving a gap between neighboring pixels on adjacent arrays no larger than 200 microns. The individual capacitors 307 on the sensing arrays 304 are placed on 100 micron centers with a capacitor size on the order to 50 microns on a side or thereabout.

The tab bonding 314 is positioned between the glass plate 320 and the preprocessors 302 so that it may connect to the preprocessors 302 and/or connect directly to the sensor arrays 304 through additional solder bumps 310 and connectors 312.

The entire assembly comprising sensing arrays 304, glass plate 320, tab bonding 314 and preprocessors 302 attached to support plates 301 and 306 is placed in a mechanical housing 330 containing the necessary structural supports, stand offs and other necessary components for mechanical stability. The overall size of the cassette is on the order of 14"×17" in the length and width dimensions and has a thickness on the order of one half inch. Ribbon connector 316 is attached to the housing 330.

As discussed above, U.S. Pat. No. 5,043,582 to Cox et al., incorporated herein by reference, discloses a number of sensor architectures with a detailed discussion of their operation and use in a complete system. These architectures operate satisfactorily to collect charge to form an image. However, there is always a need to improve the operation of such sensors. Disclosed herein are a number of different devices which can be used in the Cox et al. system.

One sensor architecture of the Cox et al. patent is depicted in FIG. 16 of the patent. This sensor comprises a sensor array formed of MOS capacitors which face a scintillator. On the opposite side of the scintillator is a preprocessor array. In order to improve the charge collection and transfer capabilities of the Cox et al. sensor, a more sophisticated pixel architecture is required. The MOS capacitor has excellent detector capabilities and can efficiently collect charge generated as a result of x-ray interaction within the absorber layers. However, it is equally important to be able to efficiently transfer that charge to the preprocessor arrays for digitization and processing. The amount of charge collected by each capacitor is very small and must be transported large distances (by semiconductor standards) to the preprocessor array. The charge transfer efficiency of the sensor array can be improved by the addition of a gain stage and impedance matching elements within the pixel. By amplifying the voltage produced by the charge collected on the MOS capacitor, a larger signal will be transferred. By matching the impedance of the pixel to the sense line, a more efficient charge transfer will occur. These changes will improve the performance of the device substantially.

Figure 17:
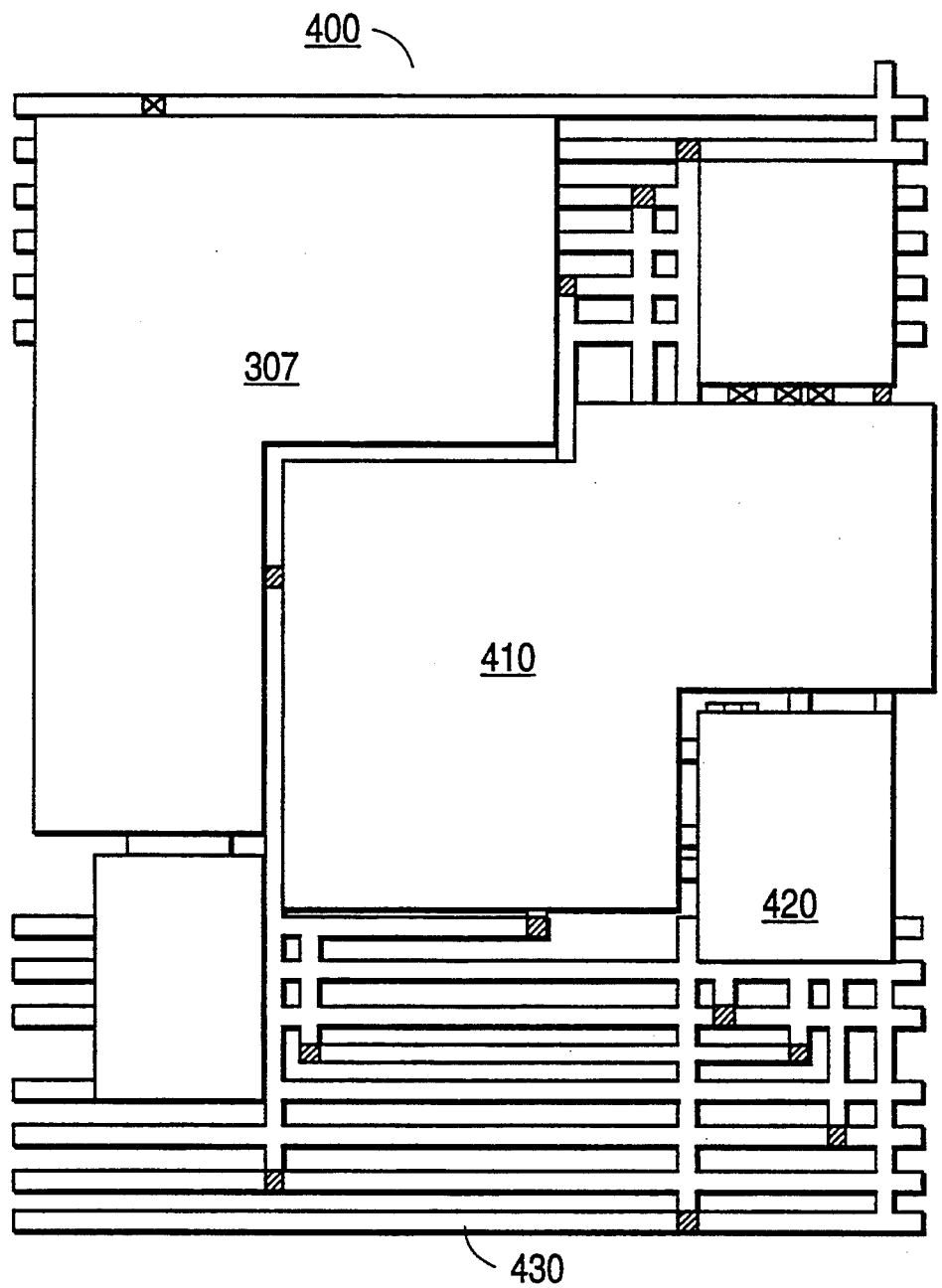
FIG. 17 is a plan view of an x-ray pixel configuration according to the present invention.
Figure 18:
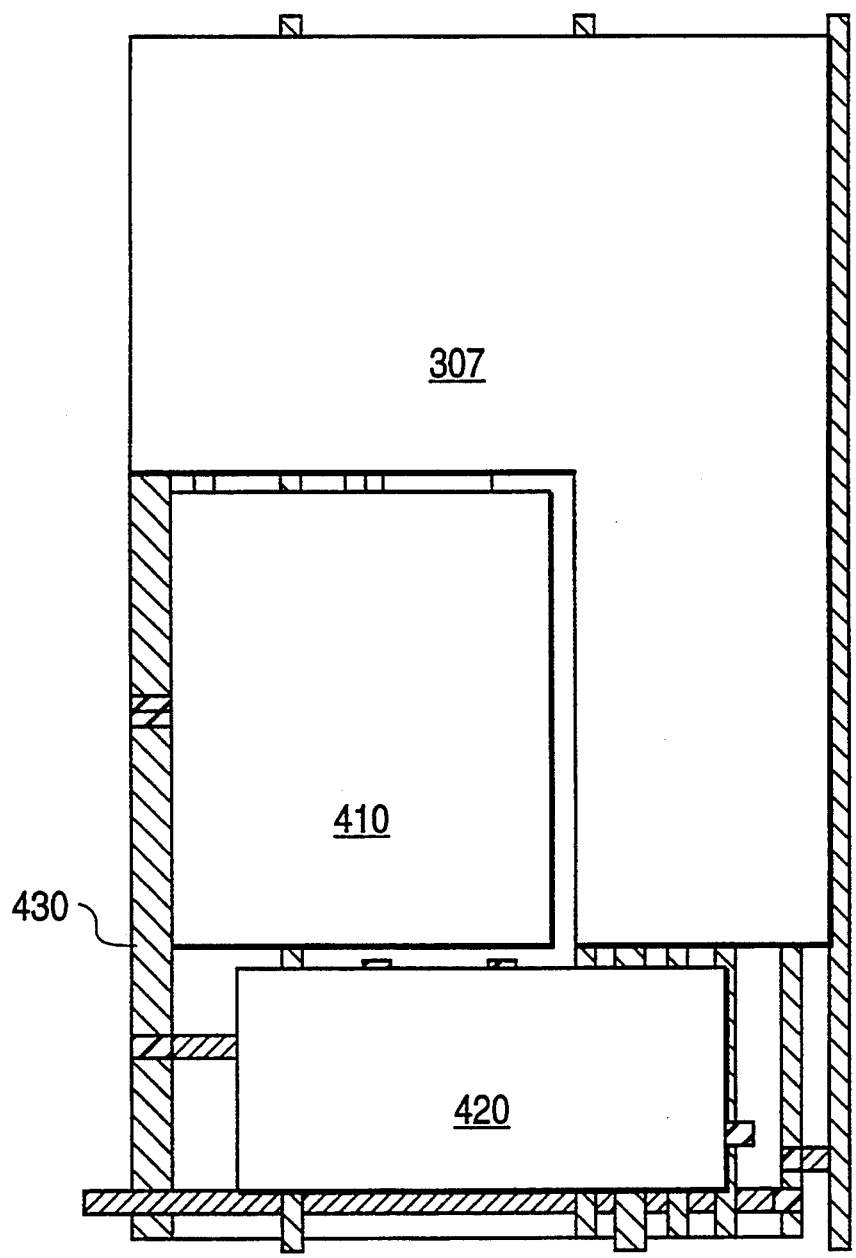
FIG. 18 is a plan view of another x-ray pixel configuration according to the present invention.

A diagram of the improved pixel architecture is as shown in FIG. 17. As shown, the pixel area is shared by the MOS capacitor 307, the gain stage 410, a set of switches 420 and the required sense and control lines 430. The added pixel components improve the charge transfer efficiency of the pixel at the expense of fill factor. Fill factor is the ratio of the sense area (i.e., MOS capacitor area) of the pixel to its total area. Clearly, a higher fill factor will improve the sensitivity and charge collection efficiency of the pixel. A balance must be struck between improved charge transfer efficiency and reduced charge collection efficiency (sensitivity). It is therefore important to provide the improved charge transfer efficiency capabilities to the pixel without greatly reducing its fill factor. FIG. 18 shows a pixel architecture with a higher fill factor. This is accomplished by utilizing smaller components that may not produce the best charge transfer characteristics but have improved fill factor and sensitivity characteristics. The larger components used in the embodiment of FIG. 17 could, for example, be operational amplifiers. These take up substantial space but have very good transfer characteristics. The smaller components used in the embodiment of FIG. 18 could be inverters. These take up considerably less space but have poorer charge transfer characteristics.

Figure 19:
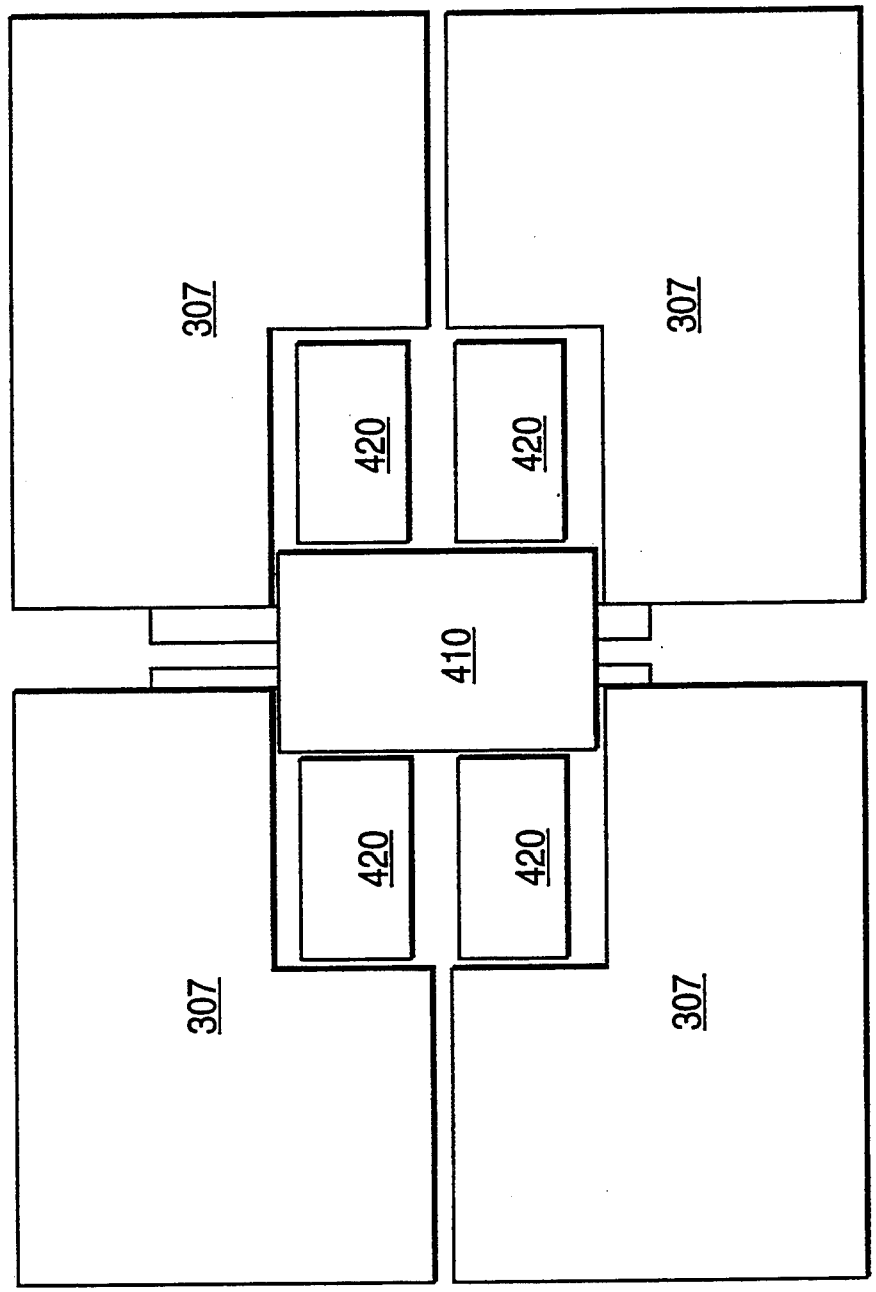
FIG. 19 is a plan view of a third x-ray pixel configuration according to the present invention.

In yet another embodiment of the improved pixel architecture, the gain stage 410, switches 420 and sense and control lines 430 are shared by neighboring pixels. In FIG. 19, a 2×2 pixel ensemble is shown where the gain stage 410 is placed in the center of four neighboring pixels and is connected through switches 420 to the four MOS capacitors 307. In this shared amplifier configuration, the fill factor can be even further improved and yet another advantage can be gained, namely, that the neighboring pixels can be summed and averaged or can be read out sequentially. The advantages of this configuration are that the device can be read out at high speed when all four pixels are averaged together to produce a lower resolution real-time (i.e., 30 frames per second) image or the pixels can be read out sequentially for a higher resolution static image. Now the device is capable of producing two types of x-ray imaging techniques (high resolution static and lower resolution real-time).

Figure 20:
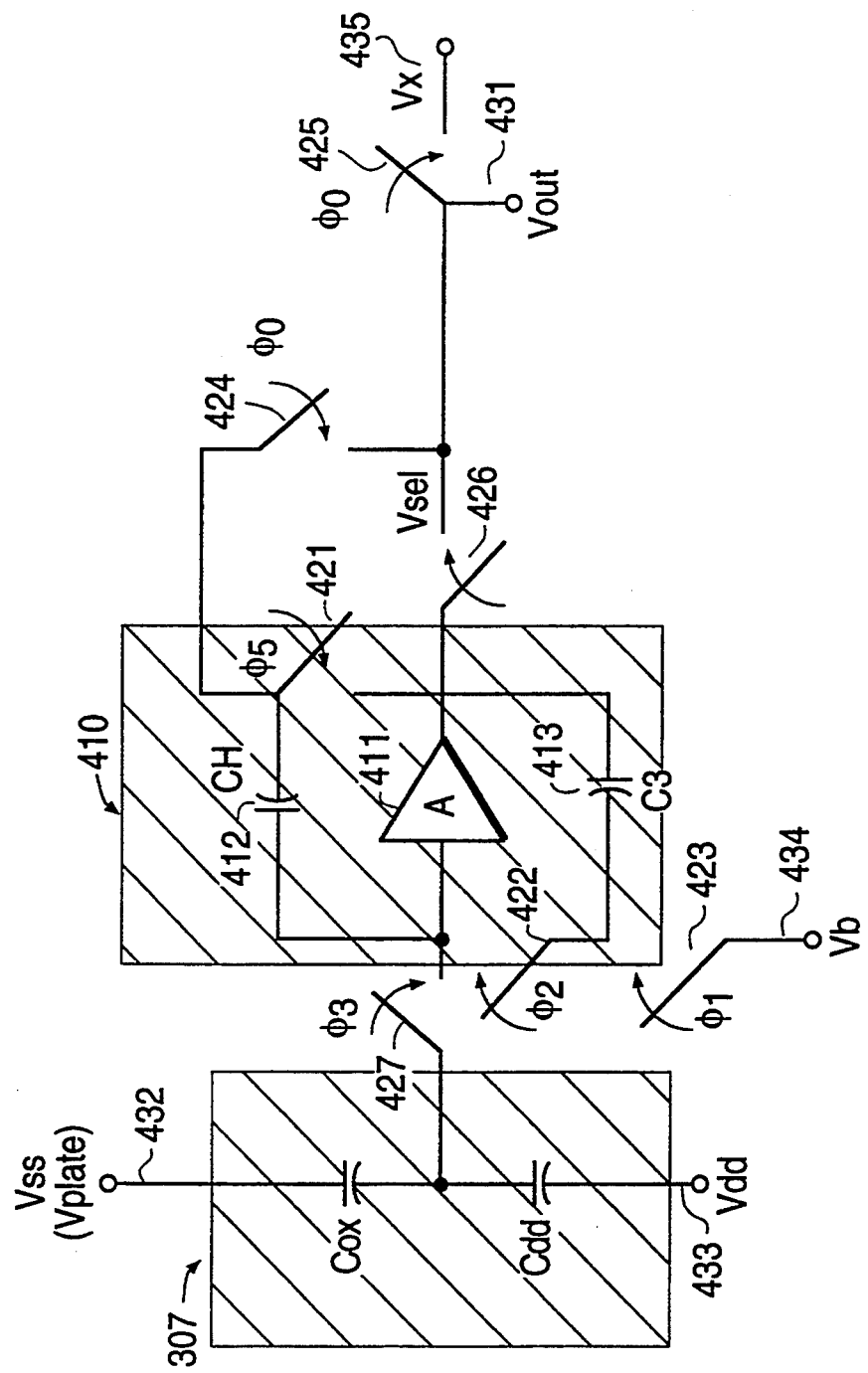
FIG. 20 is a schematic representation of an equivalent circuit for a pixel according to the present invention.

A schematic of the improved pixel architecture is shown in FIG. 20. As shown, the MOS capacitor 307 is modeled as two capacitors in series (the capacitance of the oxide layer and the substrate have distinct properties that require two separate capacitors to adequately describe). The MOS capacitor is connected to the gain stage 410 by switch 427. In the embodiment having several MOS capacitors connected to the same gain stage, plural switches 427 would be provided. The gain stage 410, is shown as an operational (Op) amplifier 411 connected to a storage capacitor (CH) 412 and a feedback capacitor (C3) 413 by a set of switches 421 and 422. The gain stage 410 is connected in turn to the MOS capacitor 307 and sense line 431 by switches 422,423,424,425 and 426. Control lines 432 and 433 supply power to the MOS capacitor 307. Control line 434 is used to charge the storage capacitor 412. Control line 435 is used to address the pixel. The gain from the gain stage is principally obtained by the ratio of capacitances between the MOS capacitor 307 and the storage capacitor 412. The capacitance of the MOS capacitor 307 is on the order of 10 to 20 times larger than that of the storage capacitor 412. Thus, when charge is transferred between the two, the quantity of charge in the storage capacitor 412 produces a larger voltage than in the MOS capacitor 307.

Because of the smaller capacitance of the storage capacitor 412, impedance matching with the data line becomes necessary. This impedance matching is effected by the feedback capacitor 413. Capacitor 413 also assists in the readout of data from the gain stage as well as reduces the slew rate requirement of the operational amplifier 411. In addition, capacitor 413 improves the finite gain sensitivity of the operational amplifier 411.

The gain circuit 410 together with its associated switches form an offset compensated switched capacitor circuit. The details of such a circuit are set forth in U.S. Pat. No. 4,543,534 to Temes et al., which is hereby incorporated by reference.

As discussed above, operational amplifier 411 as shown in FIG. 20 is used in the embodiment of FIG. 17. Smaller components such as an inverter may be used in the embodiment of FIG. 18. In either case, the ratio between the MOS capacitor and the storage capacitor determines the gain. Also, in either case, impedance matching is needed.

Since the storage capacitor 412 stores charge during the exposure interval, it is important that the capacitor be insensitive to light generated by the phosphor. To accomplish this, the storage capacitor 412 should have both of its electrodes made out of polysilicon, creating what is known as a double-poly capacitor. These types of capacitors are relatively insensitive to radiation. The fact that the sensor arrays 404 are illuminated from the substrate or back side further isolates the storage capacitor 412 from radiation since it does not reside on or in the substrate or epitaxial layer. In other words, the double-poly capacitor is formed from two polysilicon electrodes grown on the epitaxial layer, removing it from the radiation on the back or substrate side.

Another concern about the overall sensing capabilities of the pixel is the performance of the gain stage 410. To optimize the performance of the op amp 411 within the gain stage it is important to reduce its slew-rate requirements. The feedback capacitor 413 in the gain circuit acts to limit the voltage swing the amplifier 411 must experience as it switches from state to state. To keep a high fill factor in the pixel 400, a simple gain stage is required to reduce the area occupied by non-sensing elements. This creates limitations on the gain-stage performance, necessitating low-gain amplifiers or simple inverters. The use of the feedback capacitor 413 had the advantage when used with a low-gain amplifier that it reduces the signal loss that is normally experienced with low gain amplifiers.

Yet another concern about the sensing capabilities of the pixel 400 is the linearity of the MOS sensing capacitor 307. When charge is accumulated in the capacitor 307, the depletion layer shrinks, reducing the volume available for further charge collection. This results in anon-linear sensitivity since the ability of the capacitor to collect charge is related to the volume of its depletion region. One way to mitigate this problem is to shift the charge collected on the MOS capacitor 307 to the storage capacitor 412 many times during the exposure. Each time this is done, the MOS capacitor 307 is reset to its deep-depletion state, improving the linearity of its response to radiation. This technique is shown in the pixel charge-expose-read cycle in FIGS. 21a–21e.

Figure 21A:
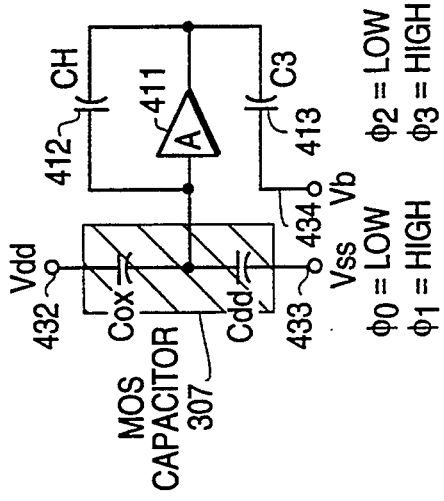
FIGS. 21a–21e show the charge-expose-read cycle of the pixel of FIG. 20.
Figure 21B:
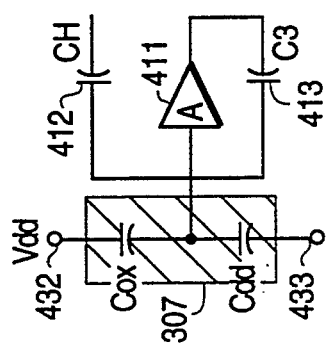
Figure 21C:
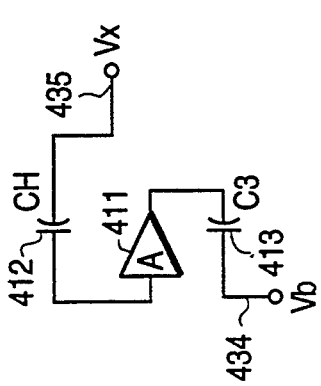
Figure 21D:
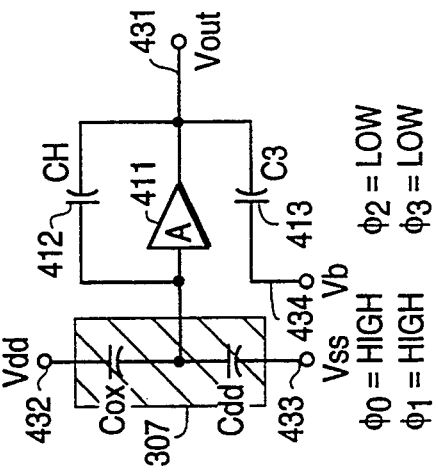
Figure 21E:
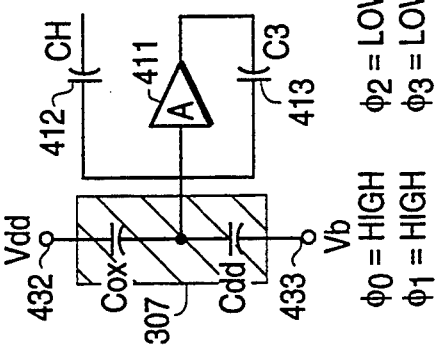

The pixel charge-expose-read cycle has five sequential steps. The first step is to precharge the storage capacitor 412, as shown in FIG. 21a. The second step is to precharge the MOS capacitor 307 as shown in FIG. 21b. The third step is to expose the MOS capacitor 307 to x-rays for the purposes of acquiring the image, as shown in FIG. 21c. The fourth step is to transfer packets of charge from the MOS capacitor 307 to the storage capacitor 412 many times during the overall expose portion of the charge-expose-read cycle, as shown in FIG. 21d. The fifth step is to read out the accumulated and amplified charge, as shown in FIG. 21e.

Figure 22:
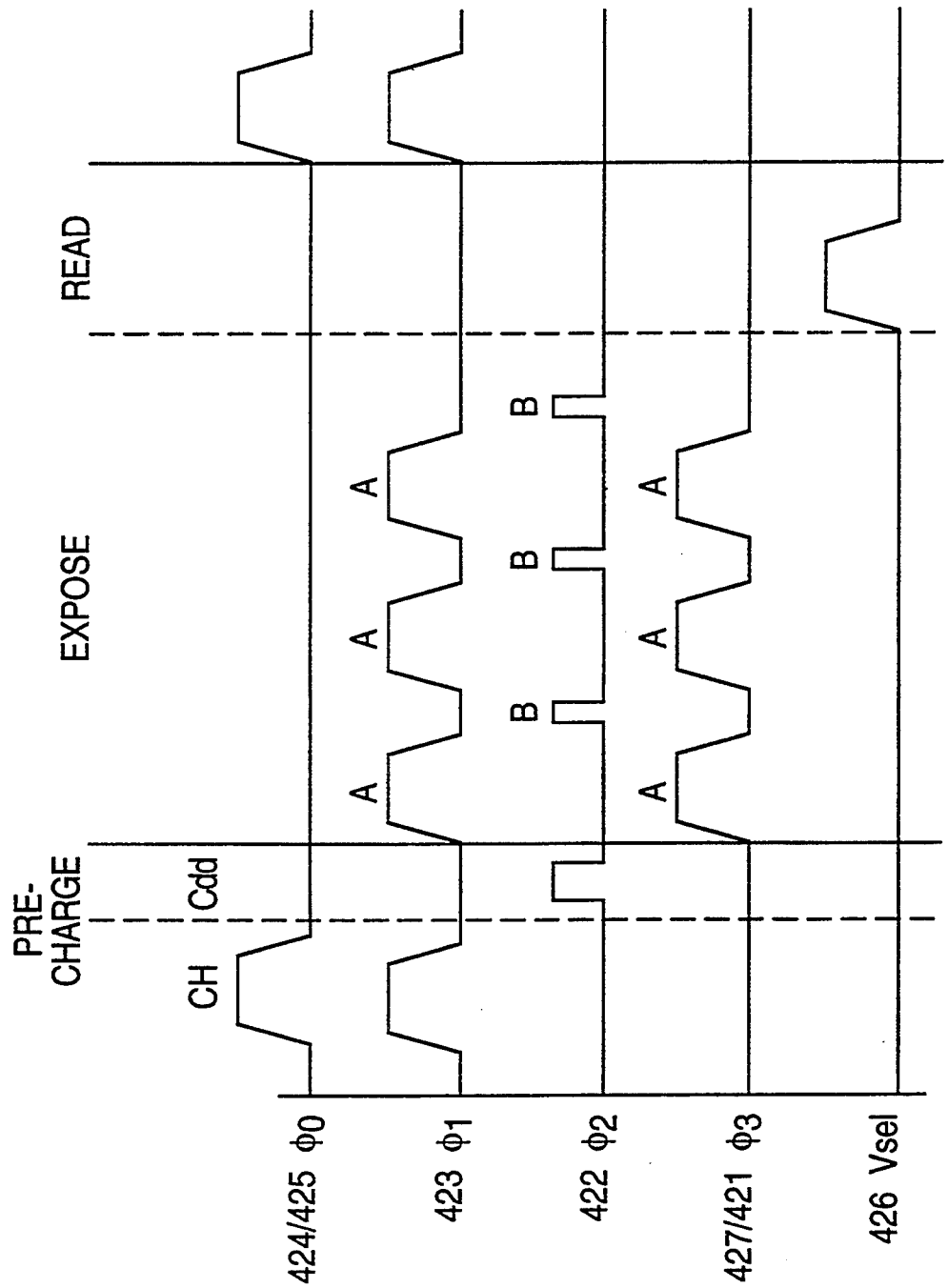
FIG. 22 is a timing chart for the charge-expose-read cycle of FIGS. 21a–21e.

FIG. 22 shows a timing diagram for the charge-expose-read cycle. As shown, there are six clocks, 421 through 426 that are switched on and off accordingly to produce the five stages of the cycle. Also shown is the relative amount of time spent for the two portions (A and B) of the exposure interval. The large majority of the time spent in the exposure interval is charge accumulation in the MOS capacitor 307, whereas only a small portion (<10 percent) of the time is spent dumping charge ont the storage capacitor 412. This is done to minimize the amount of time required to obtain an image.

The improved pixel of the present invention can be used as the sensing element in the random access sensor disclosed in FIG. 14, using the same row, column and signals lines used in regard to other pixel architectures. It will be understood by those skilled in the art that clock lines needed to implement the clock signals of FIG. 22 can easily be implemented using known technology. The manner of implementing control lines for effecting high resolution static or low resolution real time operation, discussed in connection with the embodiment of FIG. 19, would also be obvious to one skilled in the art.

The foregoing embodiments of the pixel architecture of the invention provide improved performance to the invention but further improvements to the sensitivity and longevity of the invention can be made by changing the architecture of the device structure itself. Accordingly, the sensitivity and longevity of the sensor array is improved by reversing the positions of the phosphor and the sensor array as in detector 500 shown in FIG. 23 from those shown in FIG. 16. In the configuration shown in FIG. 23, the phosphor is facing the x-ray source. In this configuration the phosphor thickness is not constrained by the fact that solder connectors need to be passed through it, as in the Cox et al. structure, limiting its practical thickness. Recent advances in phosphor doped fiberoptic plates have produced thick absorber plates that possess high resolution because of the light guiding properties of the fiberoptics. A thick phosphor that has high resolution is of particular interest to solid-state imaging applications were the added shielding properties of a thicker absorber are needed to protect the semiconductor components underneath while preserving high resolution imaging capabilities. The added shielding capabilities of the thicker phosphor in this configuration will increase the life of the sensing array, thus improving its cost competitiveness with other imaging modalities. The increased absorption properties of the thicker phosphor will improve the sensitivity of the sensor array, reducing the x-ray dose needed to obtain an image, producing yet another advantage particularly in medical applications where patient dose is of concern.

The thickness of the phosphor depends on the manner of its application. A fiber optic scintillator, in which the core of an optic is doped with a phosphor, can be on the order of 6-8 mm. This is an excellent type of scintillator for use in the present invention since the optic fiber guides the output to the sensor array with no light scattering. If a phosphor crystal is deposited on the back of the sensor array, th thickness of the phosphor layer would be on the order of 0.1-5 mm. Scintillator screens, on the other hand may be on the order of 2-3 mm.

Figure 23:
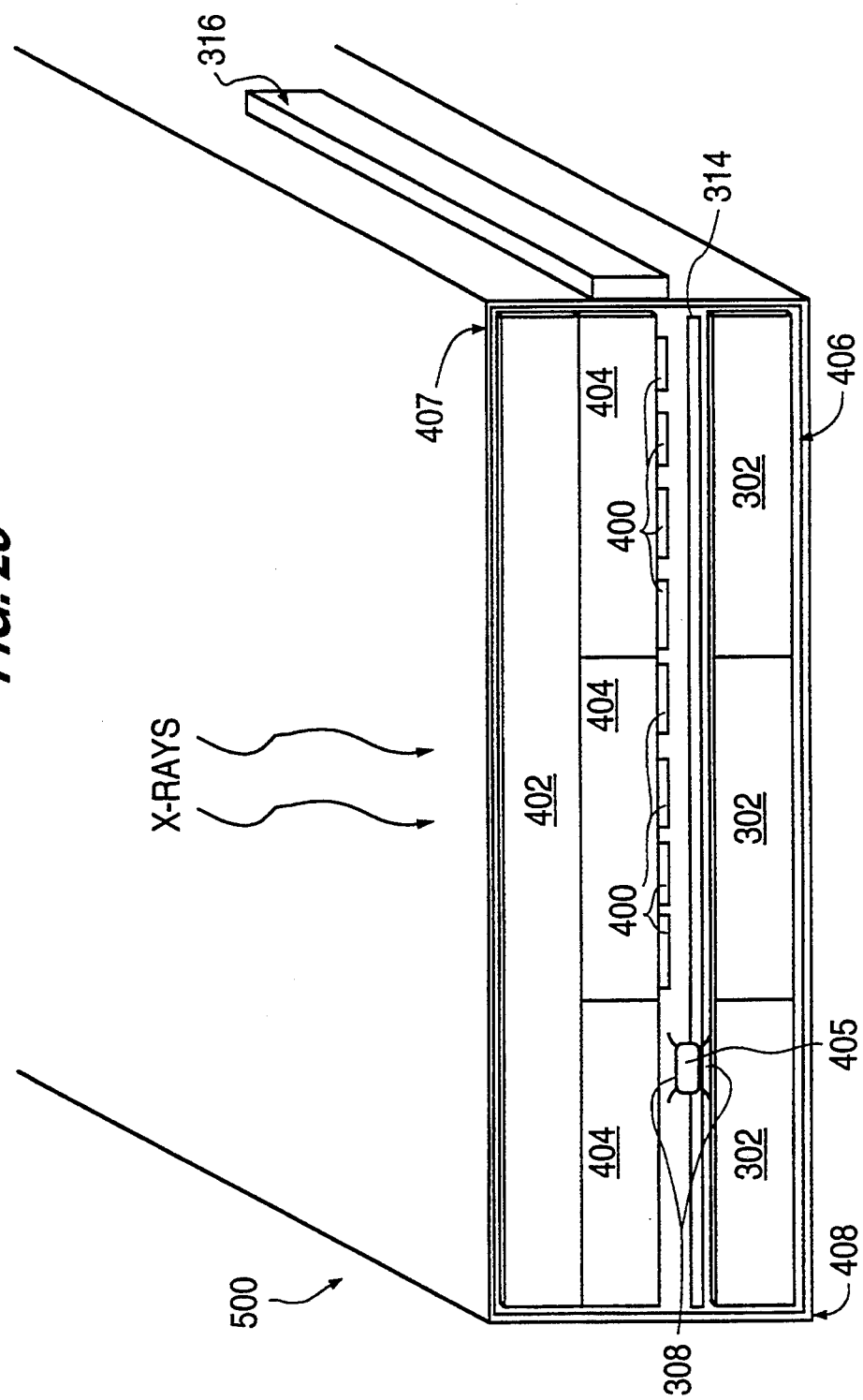
FIG. 23 is a cross sectional view of a detector configuration according to the present invention.

As shown in FIG. 23, the detector 500 comprises a first mechanical support 407, a preprocessor array having a plurality of preprocessor chips 302 mounted on a second mechanical support 406, and sensor arrays 404 mounted directly on the phosphor 402. Each sensor array 404 contains a plurality of pixels 400 interconnected by control and sense lines 430 similar to the arrangement shown in FIG. 14. Solder bumps 308 are connected to control and signal lines also depicted in FIG. 14 with respect to solder bumps 308. The solder bumps 308 are connected to solder bumps 310 on the preprocessors via gold and/or solder connectors 405. This provides a multilayer structure wherein the MOS capacitors 307 can be randomly accessed yet be closely spaced by virtue of the solder bump connections which avoid "dead spaces" in the resulting image by communicating the control and sense lines of the sensor array out of the arrays to the preprocessors 302. The preprocessors 302 communicate externally of the detector 500 through tab bonded laminated sense and data lines 314. The tab bonding comprises a thin piece of plastic with the sense and data lines laminated therein. The tab bonding connects to a ribbon connector 316 which connects to a processor such as a PC or other such image processor which extracts data and supplies power to the imager. The sense and data lines from the tab bonding may be attached to the preprocessor 302 or may attach directly to solder bumps leading to the sensor arrays 404.

The foregoing characteristics of detector 500 are similar to the detector 300 of FIG. 16, except that the sensor arrays 404 and the phosphor 402 are reversed (i.e., the phosphor is directly exposed to the x-rays whereas in detector 300 the sensor array 304 is directly exposed to the x-rays). The other main difference between these structures is that the sensor array 404 has a thinned epitaxial layer and is back-lit by the phosphor 402. Thinning the epitaxial layer of a sensor array is a technique known in the art as a way of improving the sensitivity and quantum efficiency of a visible light detector. This process has the effect of making the detector array more expensive but is justified in many cases where the incident radiation is weak. In the case of x-ray imaging in the configuration of detector 500, the detector will have a much longer useful life and will be more sensitive, thus justifying the added expense. Moreover, the reversal of the sensor array 404 and the phosphor 402 eliminates any obstruction between the sensor array 404 and the preprocessor array 302 as is the case with detector 300. By removing the obstruction (the phosphor 402), it will be much easier to make the required connections between the sensor array 404 and the preprocessor 302.

The sensor of the present invention is produced with an epitaxial layer on a substrate, similar to that shown in FIG. 13 except without the extra absorber. The substrate is removed and the epitaxial layer is grown to a maximum or is thinned to a maximum of 20 microns. The epitaxial layer should be doped to provide a 20 Ohm-cm resistance.

Because the MOS capacitors 307 in the present embodiment are illuminated through the thinned epitaxial layer of the sensor array, it is no longer important that the top surface of the capacitor be unobstructed. All of the required circuits can be routed over the capacitors or any other structure in the sensor array 404. This is an important advantage that will permit the sense and control lines 430 to be routed in such a way as to reduce the path length required to connect the circuits together.

The sensor arrays 404 are preferably arrays of pixels 400 which consist of many individual array panels containing hundreds or thousands of sensors. Each of the sensor arrays is on the order of one to two inches on a side containing the pixels 400 and all the required sense and control lines 430 and bond pads. The individual, one or two inch sensing arrays 404 are glued onto the phosphor 402 with the thinned epitaxial surface of the sensor array 400 facing the output surface of the phosphor 402. The other side of the phosphor 402 facing the x-rays is attached to the thin metal support plate 407. The sensor arrays 404 are precision machined so that they may be butted together as close as possible forming a gap between neighboring pixels 400 on adjacent arrays no larger than 200 microns. The individual pixels 400 on the sensing arrays 404 are placed on 50 to 100 micron centers with a capacitor size on the order of 25 to 50 microns on a side or thereabout.

The tab bonding 314 is positioned between the sensor arrays 404 and the preprocessors 302 so that it may connect to the preprocessors 302 and/or connect directly to the sensor arrays 404 through solder bumps 308.

The entire assembly comprising sensing arrays 404, phosphor 402, tab bonding 314 and preprocessors 302 attached to support plates. 405 and 406 is placed in a mechanical housing 408 containing the necessary structural supports, stand offs and other necessary components for mechanical stability. The overall size of the cassette is on the order of 14"×17" in the length and width dimensions and has a thickness on the order of one half inch. Ribbon connector 316 is attached to housing 408.

The foregoing description is provided for purposes of illustrating the present invention but is not deemed limitative thereof. Clearly, numerous additions, substitutions and other changes can be made to the invention without departing from the scope thereof as set forth in the appended claims.

What is claimed is:

1. An x-ray imaging system comprising:
an x-ray source for producing an x-ray spectrum of at least 30 kVp;
an x-ray detector comprising a solid state device having a plurality of contiguous solid state layers, one of said contiguous solid state layers including a semiconductor material with a plurality of charge storage devices forming pixels, each of said pixels being at least about 50 microns on a side to increase sensitivity of said detector to x-ray radiation of at least 30 keV, said x-ray radiation directly producing free electrons which interact with said charge storage devices.

2. An x-ray imaging system as set forth in claim 1 wherein said detector responds to x-rays up to 200 kVp.

3. An x-ray imaging system comprising:
an x-ray source for producing an x-ray spectrum of at least 30 kVp;
an x-ray detector comprising a solid state device having a plurality of contiguous solid state layers, one of said contiguous solid state layers including a semiconductor material with a plurality of charge storage devices, said detector having an extra absorber to increase sensitivity of said detector to x-ray radiation of at least 30 keV, said x-ray radiation directly producing free electrons which interact with said charge storage devices; and
means for displaying an image formed in response the charge storage devices.

4. An x-ray imaging system comprising:
an x-ray source for producing an x-ray spectrum of at least 30 kVp;
an x-ray detector comprising a solid state device having a plurality of contiguous solid state layers, one of said contiguous solid state layers including a semiconductor material with a plurality of charge storage devices, said charge storage devices being arranged in groups to form pixels such that each pixel is formed of a plurality of charge storage devices, said detector being responsive to x-ray radiation of at least 30 keV, said x-ray radiation directly producing free electrons which interact with said charge storage devices.

* * * * *